(12) United States Patent
Kim et al.

(10) Patent No.: US 7,495,519 B2
(45) Date of Patent: Feb. 24, 2009

(54) SYSTEM AND METHOD FOR MONITORING RELIABILITY OF A DIGITAL SYSTEM

(75) Inventors: Dae Ik Kim, Fishkill, NY (US); Jonghae Kim, Fishkill, NY (US); Moon Ju Kim, Wappingers Falls, NY (US); James R. Moulic, Poughkeepsie, NY (US); Hong Hua Song, Beijing (CN)

(73) Assignee: International Business Machines Corporation, Armonk, NY (US)

( * ) Notice: Subject to any disclaimer, the term of this patent is extended or adjusted under 35 U.S.C. 154(b) by 100 days.

(21) Appl. No.: 11/742,018

(22) Filed: Apr. 30, 2007

(65) Prior Publication Data
US 2008/0270049 A1   Oct. 30, 2008

(51) Int. Cl.
G01R 23/00 (2006.01)
H03B 5/24 (2006.01)
H03K 3/03 (2006.01)

(52) U.S. Cl. .............. 331/44; 331/57; 331/64

(58) Field of Classification Search ........... 331/44, 331/57, 64, 74, 143, 175
See application file for complete search history.

(56) References Cited

U.S. PATENT DOCUMENTS

| | | | |
|---|---|---|---|
| 4,916,389 A | 4/1990 | Hori et al. | |
| 5,493,572 A | 2/1996 | Hori et al. | |
| 5,566,185 A | 10/1996 | Hori et al. | |
| 5,712,859 A | 1/1998 | Hori et al. | |
| 5,900,735 A | 5/1999 | Yamamoto | |
| 6,173,235 B1 | 1/2001 | Maeda | |
| 6,239,603 B1 | 5/2001 | Ukei et al. | |
| 6,430,720 B1 | 8/2002 | Frey et al. | |
| 6,476,632 B1 | 11/2002 | La Rossa et al. | |
| 6,541,285 B2 | 4/2003 | Koike | |
| 6,724,214 B2 | 4/2004 | Manna et al. | |
| 6,903,564 B1 | 6/2005 | Suzuki | |
| 7,005,871 B1 | 2/2006 | Davies et al. | |
| 7,039,566 B2 | 5/2006 | Koike | |
| 7,126,365 B2 | 10/2006 | Suzuki | |

(Continued)

OTHER PUBLICATIONS

International Search Report of PCT/EP2008/054345, dated Aug. 29, 2008.

*Primary Examiner*—David Mis
(74) *Attorney, Agent, or Firm*—William E. Schiesser; Kevin P. Radigan, Esq.; Heslin Rothenberg Farley & Mesiti, P.C.

(57) ABSTRACT

System and method are provided for continually monitoring reliability, or aging, of a digital system and for issuing a warning signal if digital system operation degrades past a specified threshold. The technique includes implementing a ring oscillator sensor in association with the digital system, wherein logic and/or device percent composition of the ring oscillator sensor mirrors percent composition thereof within the digital system. Counter logic is coupled to the ring oscillator sensor for converting outputted count signals to an oscillation frequency, and control logic is coupled to the counter logic for periodically evaluating oscillation frequency of the ring oscillator sensor and generating a warning signal indicative of reliability degradation if at least one of: (i) a measured or estimated oscillation frequency is below a warning threshold frequency; or (ii) a measured or estimated rate of change in a difference between measured oscillation frequencies exceeds an acceptable rate of change threshold.

20 Claims, 17 Drawing Sheets

U.S. PATENT DOCUMENTS

| | | |
|---|---|---|
| 7,157,948 B2 * | 1/2007 | McClannahan et al. ..... 327/151 |
| 2002/0000824 A1 | 1/2002 | Chetlur et al. |
| 2003/0204820 A1 | 10/2003 | Asano et al. |
| 2004/0051553 A1 | 3/2004 | Manna et al. |
| 2004/0148111 A1 | 7/2004 | Gauthier et al. |
| 2005/0140418 A1 | 6/2005 | Muniandy et al. |
| 2005/0168255 A1 | 8/2005 | Cauthier et al. |
| 2005/0212547 A1 | 9/2005 | Suzuki |
| 2005/0273290 A1 | 12/2005 | Asano et al. |
| 2005/0280477 A1 | 12/2005 | Reddy et al. |
| 2006/0100811 A1 | 5/2006 | Bhushan et al. |
| 2006/0158210 A1 | 7/2006 | Tsai et al. |
| 2006/0223201 A1 | 10/2006 | Liu et al. |
| 2006/0282725 A1 | 12/2006 | Kerber et al. |
| 2007/0013452 A1 | 1/2007 | Bhushan et al. |

* cited by examiner

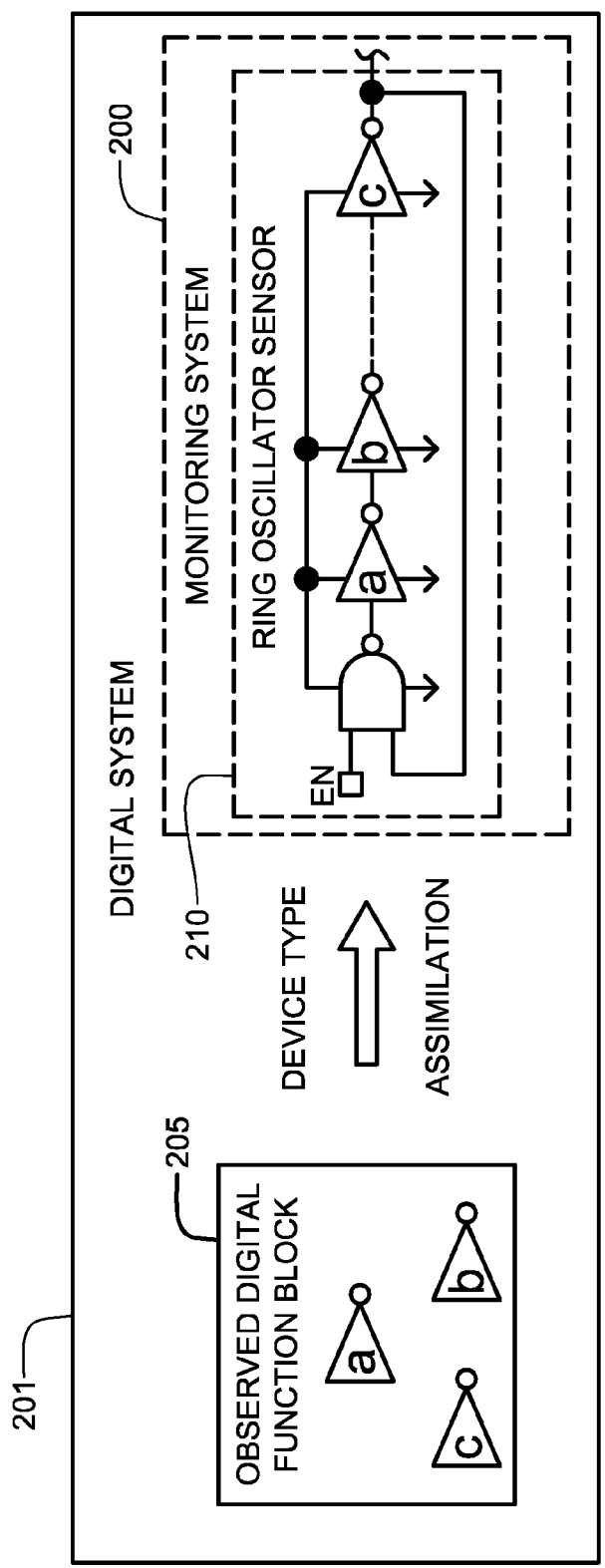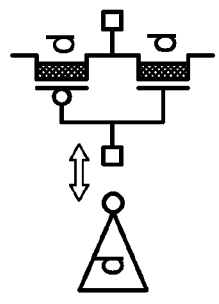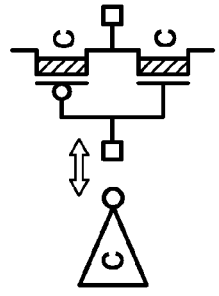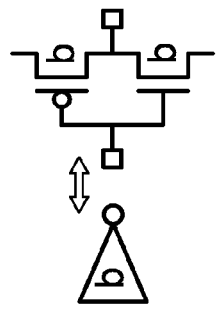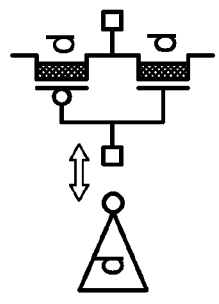
FIG. 2
FIG. 2A  FIG. 2B  FIG. 2C  FIG. 2D

US 7,495,519 B2

SYSTEM AND METHOD FOR MONITORING RELIABILITY OF A DIGITAL SYSTEM

TECHNICAL FIELD

The present invention relates in general to the field of failure prediction and, more specifically, to a ring oscillator sensor-based reliability measurement system and method for a digital system.

BACKGROUND OF THE INVENTION

Failure rates of individual components making up a digital system such as an integrated circuit (or larger system) are fundamentally related to various parameters, including operating temperatures, as well as scaling of the digital system and interconnect geometries. Although burn-in testing of digital systems attempts to predict a lifecycle for a given type of digital system, it does not provide aging information for each specific digital system of the type being manufactured. Currently, a customer or user may uncover a problem with a digital system only after a catastrophic system failure. While catastrophic failure of a digital system is readily recognizable, a "soft" failure (where there may be significant degradation in digital system performance or reliability) may go unnoticed, which implies that such aging of the digital system may cause undetected errors in computation and data, from which it is difficult to recover.

SUMMARY OF THE INVENTION

Presented herein is an approach for actively monitoring or estimating aging, and hence reliability, of a specific digital system and for issuing a warning signal if, for example, degradation of operation thereof, or more particularly, of an associated ring oscillator sensor, exceeds a specified threshold.

Thus, in one aspect, a system for monitoring reliability of a digital system is provided. This system includes: at least one ring oscillator sensor implemented in association with the digital system for facilitating monitoring reliability thereof, wherein the digital system includes a circuit composition comprising at least one logic type, the at least one logic type comprising at least one device type. The at least one ring oscillator sensor includes a circuit composition comprising one or more of the at least one logic type or the at least one device type selected based on the circuit composition of the digital system to correlate aging of the at least one ring oscillator sensor to aging of the digital system. The at least one ring oscillator sensor outputs count signals, and the system further includes counter logic and control logic. The counter logic is coupled to the at least one ring oscillator sensor for converting the count signals to an oscillation frequency, while the control logic is coupled to the counter logic for periodically evaluating oscillation frequency of the at least one ring oscillator sensor and generating a warning signal indicative of reliability degradation thereof, and hence of the digital system, if at least one of: (i) a measured or estimated oscillation frequency of the at least one ring oscillator sensor is below a warning threshold frequency for the digital system; or (ii) a measured or estimated rate of change in a difference between measured oscillation frequencies of the at least one ring oscillator sensor exceeds an acceptable rate of change threshold for the digital system.

In another aspect, a system for monitoring reliability of a digital system is provided which includes at least one ring oscillator sensor embedded within the digital system for facilitating monitoring reliability thereof. The digital system includes a circuit composition comprising at least one logic type and at least one device type employed within the at least one logic type. The at least one ring oscillator sensor includes a circuit composition at least partially mirroring percentages of the at least one logic type and the at least one device type employed in the circuit composition of the digital system, wherein aging of the at least one ring oscillator sensor is correlated to aging of the digital system. The at least one ring oscillator sensor outputs count signals, and the system further includes counter logic and control logic. The counter logic is coupled to the at least one ring oscillator sensor for converting count signals to an oscillation frequency, while the control logic is coupled to the counter logic for periodically evaluating oscillation frequency of the at least one ring oscillator sensor and generating a warning signal indicative of reliability degradation thereof, and hence of the digital system, if at least one of: (i) a measured or estimated oscillation frequency of the at least one ring oscillator sensor is below a warning threshold frequency for the digital system; or (ii) a measured or estimated rate of change in a difference between measured oscillation frequencies of the at least one ring oscillator sensor exceeds an acceptable rate of change threshold for the digital system.

In a further aspect, a method of monitoring reliability of a digital system is provided. This method includes: obtaining at least one ring oscillator sensor embedded within a digital system for facilitating monitoring reliability thereof, the digital system including a circuit composition comprising at least one logic type, the at least one logic type comprising at least one device type, and wherein logic and device type composition percentages for the at least one ring oscillator sensor mirror circuit composition percentages of one or more of the at least one logic type or the at least one device type within the digital system, thereby correlating aging of the at least one ring oscillator sensor to aging of the digital system, the at least one ring oscillator sensor outputting count signals; converting the count signals of the at least one ring oscillator sensor to an oscillation frequency of the at least one ring oscillator sensor; and periodically evaluating oscillation frequencies of the at least one ring oscillator sensor, and generating a warning signal indicative of a reliability degradation thereof, and hence of the digital system, if at least one of: (i) a measured or estimated oscillation frequency of the at least one ring oscillator sensor is below a warning threshold frequency for the digital system; or (ii) a measured or estimated rate of change in a difference between measured oscillation frequencies of the at least one ring oscillator sensor exceeds an acceptable rate of change threshold for the digital system.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 2 depicts one embodiment of a digital system employing a monitoring system assimilating device types of the digital system within the ring oscillator sensor, in accordance with an aspect of the present invention;

FIGS. 2A-2D depict various device type examples for inverter logic employable in a digital system to be monitored, in accordance with an aspect of the present invention;

DETAILED DESCRIPTION OF THE INVENTION

Figure 1:
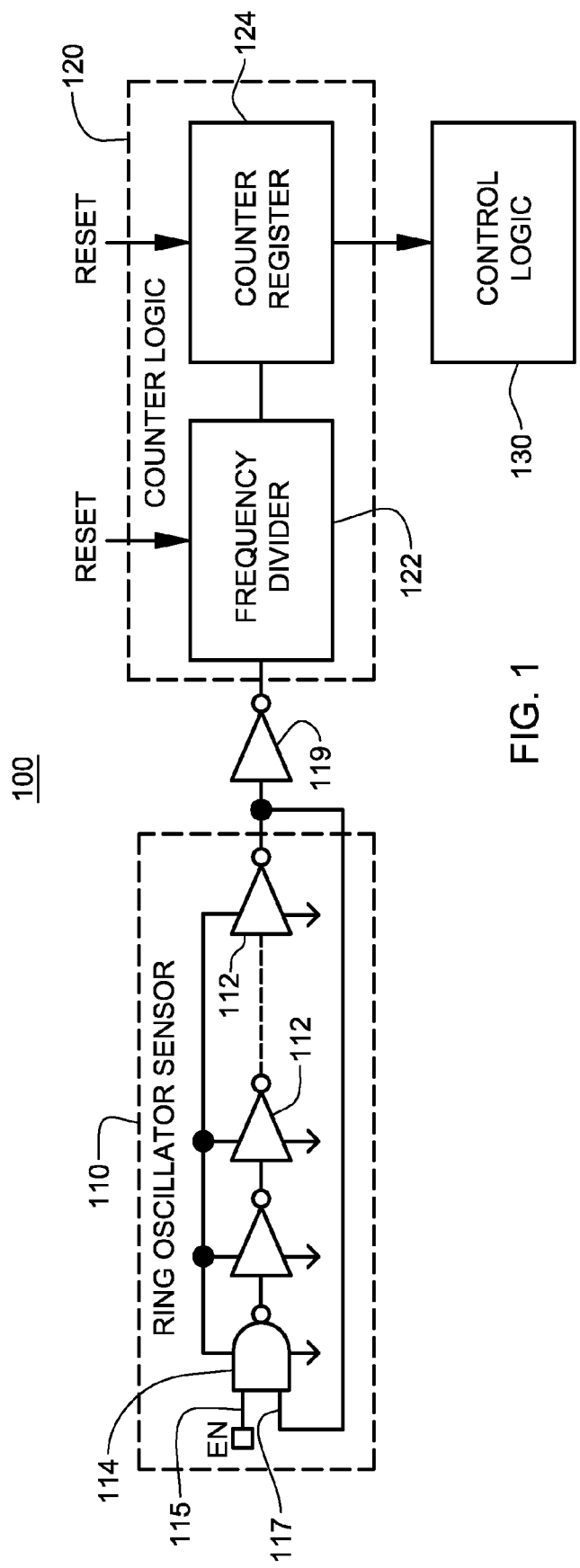
FIG. 1 depicts one embodiment of a monitoring system, in accordance with an aspect of the present invention.

As noted, presented herein are a monitoring system and method for actively tracking aging, and hence reliability, of a specific digital system, and for issuing a warning signal if, for example, degradation of the monitoring system exceeds a pre-specified threshold. The "digital system" refers to any digital system or circuit, and includes, for example, a processor, as well as simple or complex non-processor based digital logic, memory, etc. As one specific example, the digital system is a microprocessor, and the specified threshold is a predefined acceptable level for the maximum frequency of operation of the digital system.

More particularly, presented herein is a technique for monitoring reliability of a digital system employing one or more ring oscillator sensors implemented in association with (e.g., embedded within) the digital system. In one embodiment, the one or more ring oscillator sensors are integrated into the digital system within available space thereof. As a specific example, the digital system may comprise a semiconductor device, and the one or more ring oscillator sensors are integrated into the semiconductor device adjacent to or within one or more digital function blocks (or one or more circuit areas) of the digital system to be monitored to facilitate correlation of aging of the ring oscillator sensors with aging of the digital system.

Further, in accordance with an aspect of the present invention, the one or more ring oscillator sensors of the monitoring system have a circuit composition comprising one or more logic types and/or device types mirroring the circuit composition of the digital system to be monitored. As used herein "logic type" refers to a type of logic circuit such as an AND logic circuit, a NAND logic circuit, an OR logic circuit, a NOR logic circuit, or an INVERTER circuit. "Device type" refers to a type of device used to implement a specific logic type. For example, thin oxide devices, thick oxide devices, low VT-doped devices, or high VT-doped devices may be employed in implementing one or more logic types of the circuit composition of the digital system. In one example, the device type refers to a transistor type, and includes one or more of thin oxide transistors, thick oxide transistors, low VT-doped transistors and high VT-transistors.

As one example, if the circuit composition of the digital system to be monitored comprises multiple logic types, with the multiple logic types including 50% NAND logic circuits and 50% INVERTER logic circuits, then the ring oscillator sensor implemented in association with the digital system includes a composition which mirrors the circuit composition of the digital system, that is, it includes 50% NAND logic circuits and 50% INVERTER logic circuits. Similarly, if the 50% NAND logic circuits of the circuit composition of the digital system are 100% thin oxide devices, then the 50% NAND logic circuits in the ring oscillator sensor are also 100% thin oxide devices. In this manner, multiple device types used in implementing the logic types of the digital system's circuit composition are also mirrored within the ring oscillator sensor implemented in association with the digital system. This allows for better correlation between aging of the digital system and aging of the ring oscillator sensor associated with the digital system. Further, oscillation frequency of the ring oscillator sensor is more closely tailored to the maximum frequency of operation of the digital system since different device types and logic types typically have different speeds of operation.

In addition to one or more ring oscillator sensors, the monitoring system and method presented herein employ counter logic and control logic. The counter logic is coupled to the ring oscillator sensors for converting count signals of a ring oscillator sensor to an oscillation frequency. The control logic is coupled to the counter logic for periodically evaluating oscillation frequency of the one or more ring oscillator sensors and for generating a warning signal indicative of reliability degradation thereof, and hence of the digital system, if at least one of: (i) a measured or estimated oscillation frequency of the at least one ring oscillator sensor is below a warning threshold frequency for the digital system; or (ii) a measured or estimated rate of change in a difference between measured oscillation frequencies of the at least one ring oscillator sensor exceeds an acceptable rate of change threshold for the digital system. In one implementation, the counter logic and control logic are coupled to multiple ring oscillator sensors implemented in association with the digital system. In alternate implementations, each ring oscillator sensor may have its own associated counter logic and control logic performing the above-noted functions, in which case multiple separate monitoring systems would be implemented across the digital system.

The above-noted and other aspects of the present invention are described further below with reference to FIGS. 1-17.

Current techniques for monitoring aging of a digital system have a number of drawbacks. Typically, there is an absence of physical transducers to directly sense and measure digital system aging, and system level aging detection detects only a "machine check" or application software error. There is no direct technique for measuring aging of a particular digital system. Further, there is no technique for warning of an impending age related failure in a digital system, and there is no technique available to avoid computational glitches arising from a "soft aging" scenario. Digital system testing is conventionally expensive, time-consuming and not comprehensive.

In a typical digital system lifecycle model, the digital system has a higher maximum frequency of operation ($F_{MAX}$) than a specified (i.e., required) maximum frequency of operation for the digital system ($F_{SPEC}$) when manufactured and beginning its lifecycle. As the digital system ages, several factors may degrade system performance, and hence decrease maximum operating frequency as a result. Factors which degrade digital system performance depend upon the particular system at issue and the environment within which the system is used. For example, if the digital system comprises a processor, aging can be caused by a variety of factors, including hot election, electromigration and thermal expansion of the digital system.

Two failure modes are possible. First, a hard failure is representative of an abrupt failure of the digital system. Soft aging occurs where operation of the digital system gradually decreases to a level at or below the manufacturer specified minimum frequency of operation ($F_{SPEC}$). Due to the gradual nature of this aging, the soft aging failure may go unnoticed, which implies that such aging may cause undetected errors in computation and data. Once the maximum frequency of operation of the digital system ($F_{MAX}$) is known to fall below the manufacturer specified maximum frequency of operation for the digital system ($F_{SPEC}$) (meaning that the digital system fails to operate at the required conditions), then the system must be replaced or repaired. Unfortunately, an accumulated aging effect with the system operating at or near the manufacturer specified maximum frequency of operation ($F_{MAX}$) might result in a single bit error in a block of data, making it difficult to detect occurrence of such an error employing a test instruction vector. This traditionally makes it difficult to distinguish the boundary between good and bad data results in an aging digital system.

FIG. 1 depicts one embodiment of a monitoring system to be implemented in association with a digital system for monitoring reliability of the digital system. This monitoring system, generally denoted 100, includes one or more ring oscillator sensors 110, one or more drivers 119, one or more counter logic blocks 120, and one or more control logic blocks 130. Each ring oscillator sensor 110 has a composition which typically comprises multiple components. In the embodiment of FIG. 1, ring oscillator sensor 110 includes a plurality of inverters 112 connected in-series with a two-input NAND logic circuit 114. A first input to NAND circuit 114 is an enable input 115, and a second input is a feedback signal 117 from the output of ring oscillator sensor 110. A common power supply voltage VDD drives the components of the ring oscillator sensor. This ring oscillator sensor 110, when correlated to and implemented in association with a digital system, provides a circuit level sensor/transducer for sensing digital processor aging.

As explained further below, by implementing the ring oscillator sensor in association with the digital system (e.g., in available space on a semiconductor die containing the digital system), aging of the ring oscillator sensor can be tailored to closely mirror or correlate to aging of the digital system. Ring oscillator sensor 110 is an analog ring oscillator sensor, which is isolated from counter logic 120 via driver 119. Counter logic 120 includes a frequency divider 122, which functions as an analog-to-digital converter, and a counter register 124, which is optional and is employed to reduce the number of bits needed to implement the counter logic. Correlation of the ring oscillator sensor-to-digital system aging can be enhanced, as explained herein, by providing (for example) multiple ring oscillator sensors associated with specific digital function blocks of the digital system and/or multiple ring oscillator sensors associated with different circuit areas of the digital system, and by powering each ring oscillator sensor employing a common power supply as used by the associated digital function block or circuit area of the digital system, and enabling each ring oscillator sensor only responsive to receipt of a request at the digital function block (or circuit area), thus ensuring the ring oscillator sensor is only active when the corresponding digital function block (or circuit area) is active. These and other aspects of the present invention are described in detail below.

Advantageously, the ring oscillator sensor presented herein assimilates digital logic performance and hence the aging effect of the digital system. The ring oscillator sensor is a simple circuit which is a low-power sensor and is employed in conjunction with high-accuracy counter logic. Control logic 130 implements one of a variety of processes for periodically evaluating oscillation frequency of the one or more ring oscillator sensors and for generating a warning signal indicative of reliability degradation thereof, and hence of the digital system to which the ring oscillator system is correlated by design and operation.

FIG. 2 depicts a simplified embodiment of a digital system 201 comprising an observed or monitored digital function block 205, and a monitoring system 200 having a ring oscillator sensor 210 with a circuit composition which assimilates the device type composition of the digital function block 205.

As illustrated, digital function block 205 has a circuit composition which comprises one logic type, that is, an inverter logic circuit. However, each inverter logic circuit is implemented using a different device type. By way of example, FIGS. 2A-2D depict four possible device types for implementing an inverter logic circuit. In FIG. 2A, a thin oxide device is illustrated comprising a parallel connected NFET and PFET pair. In FIG. 2B, a thick oxide device is illustrated, while in FIGS. 2C & 2D, a low VT-doped device, and high VT-doped device, respectively, are depicted. Each of these figures represents a different device type as the term is employed in the present invention. Other logic circuits could be similarly implemented with different device types such as illustrated for the inverters of FIGS. 2A-2D. In one example, the device type refers to a transistor design type having different functional characteristics. To enhance correlation in the aging effect, the ring oscillator sensor employed in FIG. 2 assimilates the device types used in the monitored digital function block 205.

Figure 3:
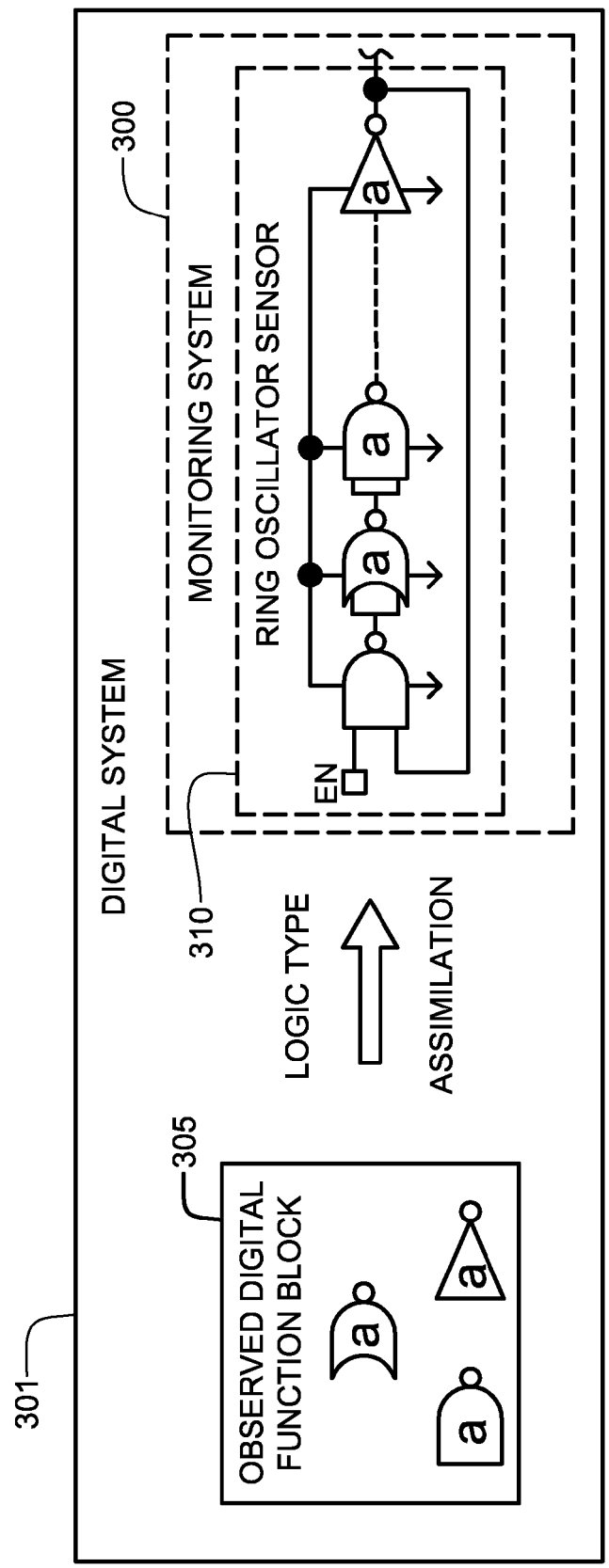
FIG. 3 depicts an alternate embodiment of a digital system employing a monitoring system assimilating logic types of the digital system within the ring oscillator sensor, in accordance with an aspect of the present invention.

FIG. 3 depicts an alternate embodiment of a digital system 301 and a monitoring system 300, in accordance with an aspect of the present invention. In this embodiment, digital system 301 includes an observed digital block 305 which comprises different logic types. The monitoring system 300 has a ring oscillator sensor 310 which has a logic circuit composition that mirrors the circuit composition of the observed digital block 305. In particular, the logic type composition in the observed digital block 305 is assimilated in the ring oscillator sensor 310. In this example, a NOR logic circuit, NAND logic circuit and inverter logic circuit are implemented within the observed digital block 305. Thus, the ring oscillator sensor 310 assimilates percentages of these logic components into the chain of logic devices defining the ring oscillator sensor. By way of example, if 50% of the observed digital function block 305 comprises NOR logic circuits, 25% NAND logic circuits and 25% inverter logic circuits, then the similar circuit composition percentages would, in one embodiment, be substantially repeated within the ring oscillator sensor. That is, the ring oscillator sensor would be implemented with approximately 50% NOR logic circuits, 25% NAND logic circuits and 25% inverter logic circuits. In this example, the logic types are each implemented using device type "a".

Figure 4:
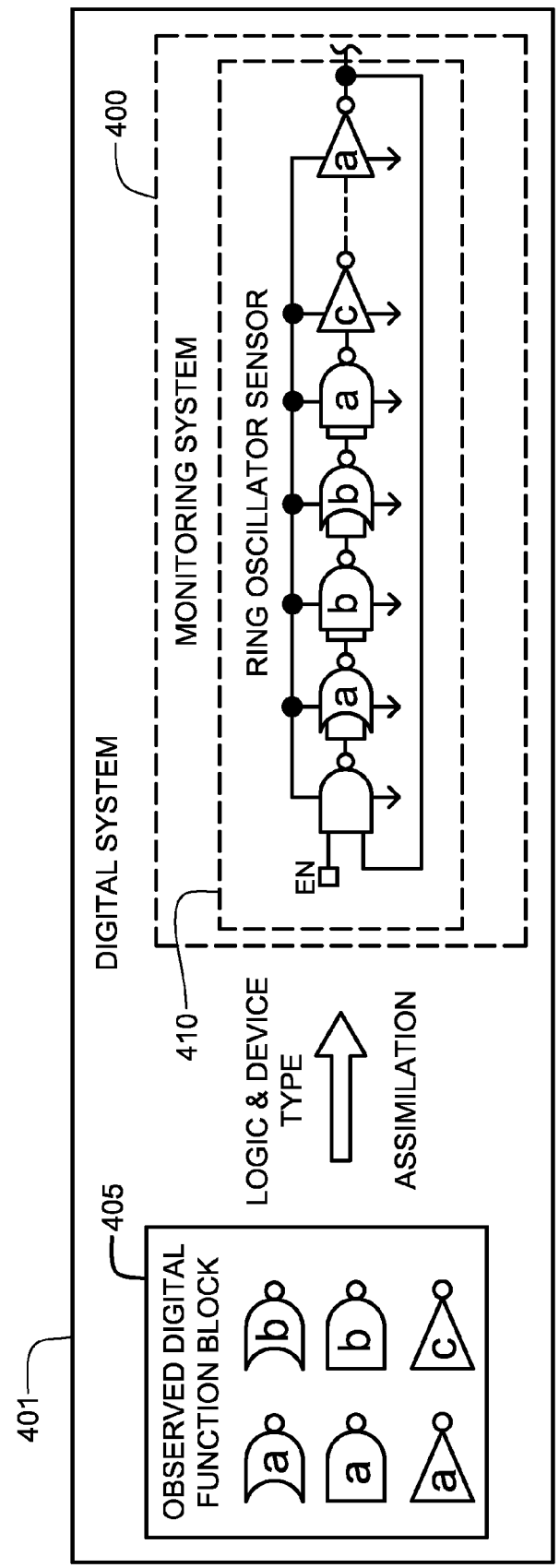
FIG. 4 depicts a further embodiment of a digital system employing a monitoring system assimilating both logic and device types of the observed digital block within the ring oscillator sensor thereof, in accordance with an aspect of the present invention.

In FIG. 4, a digital system 401 is illustrated wherein an observed digital function block 405 includes multiple logic types and multiple device types. Thus, the associated monitoring system 400 has a ring oscillator sensor 410 which assimilates both the multiple logic types and the multiple device types. More particularly, the observed digital block 405 is shown to include multiple NOR logic circuits, NAND logic circuits and inverter logic circuits, each of which is implemented using a different device type (i.e., device type "a", device type "b" and device type "c"). The ring oscillator sensor has a circuit composition with logic and device type percentages that mirror the circuit composition of the observed digital block. In this case, 33% NOR logic circuits, 33% NAND logic circuits and 33% inverter logic circuits, with 50% of the NOR logic circuits being device type "a", and 50% device type "b", 50% of the NAND logic circuits being device type "a", and 50% device type "b", and 50% of the inverter logic circuits being device type "a", and 50% device type "c".

Figure 5:
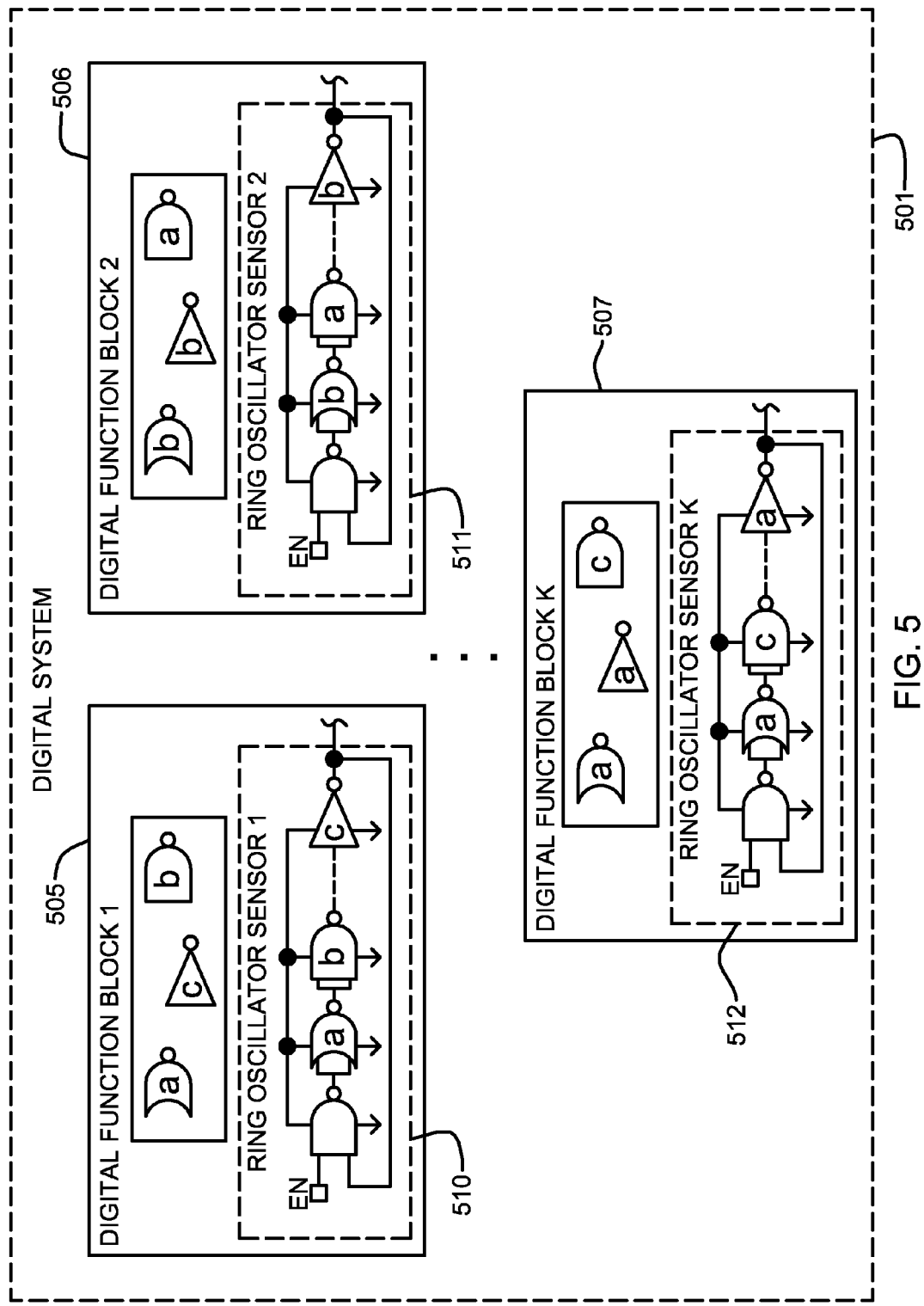
FIG. 5 depicts a digital system comprising multiple digital function blocks, each having an associated ring oscillator sensor of a monitoring system, wherein each ring oscillator sensor assimilates percentages of logic types and device types of the digital system, in accordance with an aspect of the present invention.

In FIG. 5, the digital system 501 is shown to comprise multiple digital function blocks (including a digital function block 1 505, digital function block 2 506 and digital function block k 507). Each digital function block has an associated ring oscillator sensor (i.e., sensors 510, 511 & 512, respectively). As in the above examples, each ring oscillator sensor 510, 511 & 512 assimilates the logic type(s) and device type (s) of the corresponding digital function block to be monitored. In this way, aging of each ring oscillator sensor is tailored to closely correlate to aging of the respective digital function block being monitored.

Figure 6:
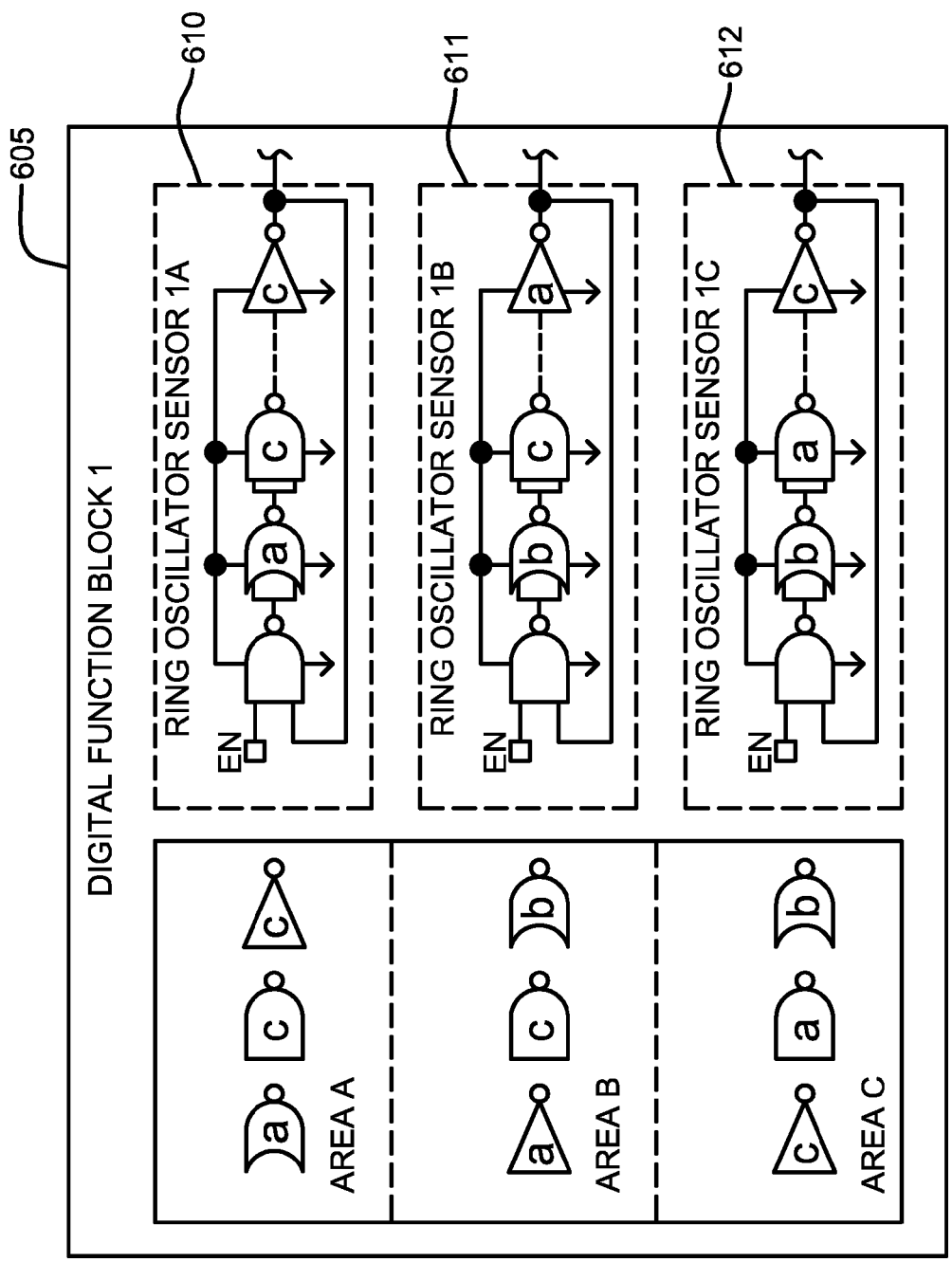
FIG. 6 depicts one embodiment of a digital function block having multiple circuit areas, each having an associated ring oscillator sensor of a monitoring system assimilating percentages of logic types and device types of the digital system, in accordance with an aspect of the present invention.

FIG. 6 depicts a single digital function block 1 605 having multiple circuit areas (i.e., circuit area a 606, circuit area b 607 and circuit area c 608), within which the digital function block is implemented. By way of example, a digital function block could be disposed within or across a semiconductor device with different concentrations of circuit elements disposed at different locations within the semiconductor device. Thus, aging of certain components at one location may be different from aging of other components at another location within a given digital function block (or within a given digital system). In this example, multiple ring oscillators 610, 611 & 612 are therefore provided each having a composition which assimilates the circuit composition of the corresponding circuit area 606, 607 & 608 to be monitored. The assimilation again is such that the composition of the corresponding ring oscillator sensor closely mirrors the logic type and device type employed in the circuit area being monitored.

Figure 7:
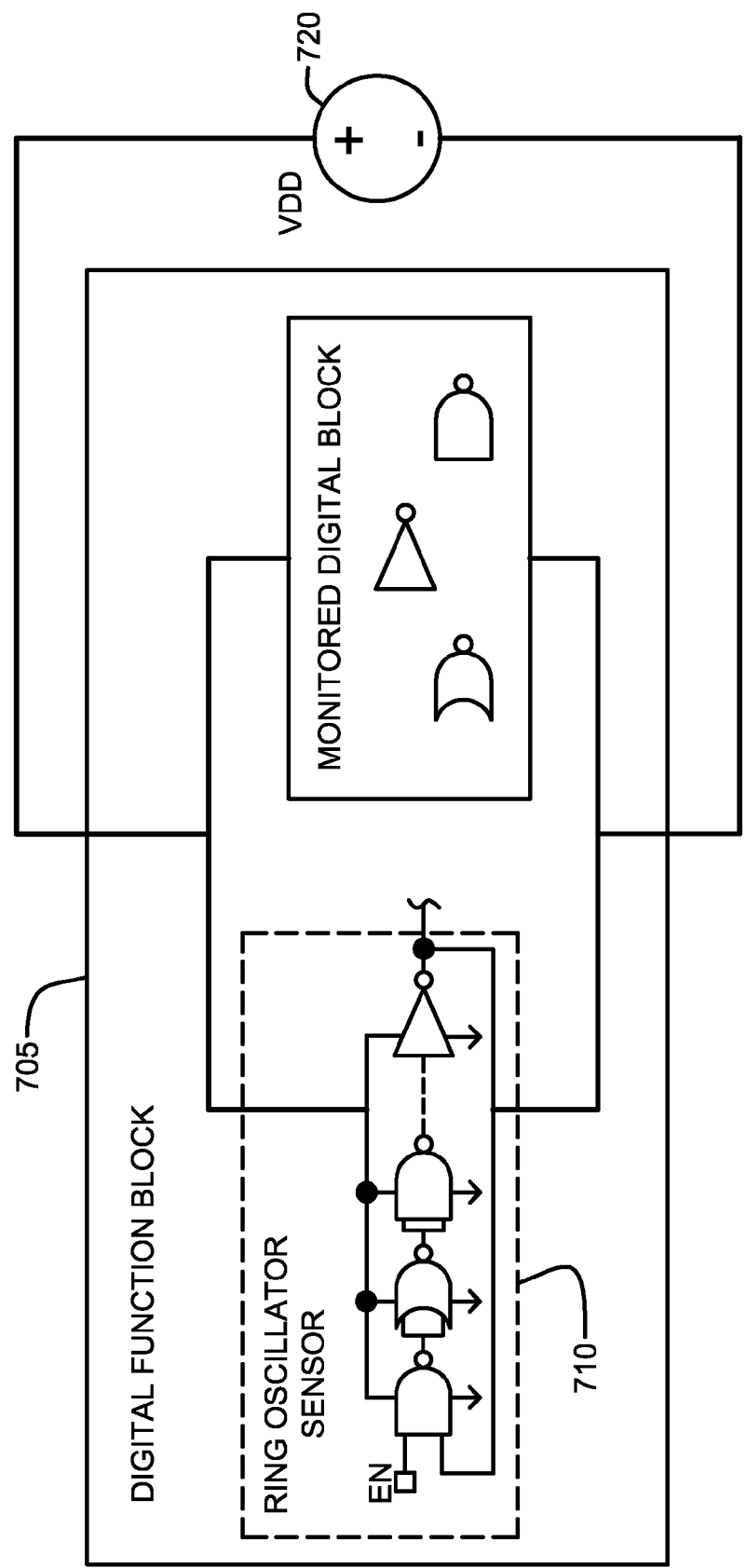
FIG. 7 depicts one embodiment of a digital function block having an associated ring oscillator sensor of a monitoring system powered by a same power supply as the digital function block being monitored, in accordance with an aspect of the present invention.

In addition to correlating aging of the ring oscillator sensor to the digital system or digital function block based on logic and device type, powering and operation of the ring oscillator sensor can also be tied to the digital system or digital function block being monitored. In FIG. 7, a digital function block 705 is illustrated wherein the monitored digital block is powered by a power supply VDD 720 which also powers the monitoring ring oscillator sensor 710. By powering the ring oscillator sensor with the same power supply as used to drive the monitored digital function block, better aging correlation can be achieved since the sensor experiences the same power level fluctuations as the digital block being monitored.

Figure 8:
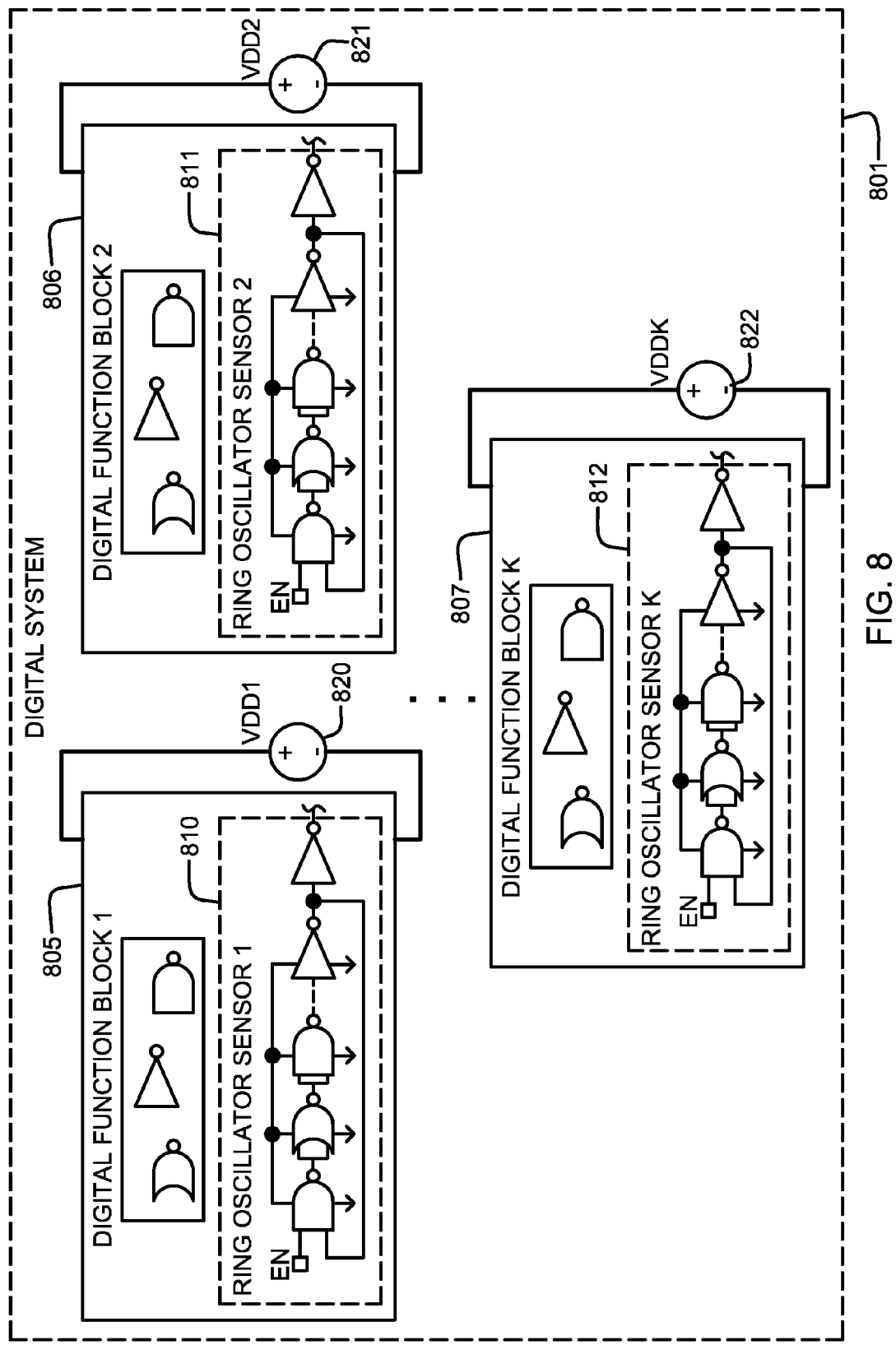
FIG. 8 depicts one embodiment of a digital system having multiple digital function blocks, each having an associated ring oscillator sensor of a monitoring system powered by a same power supply as the digital function block, in accordance with an aspect of the present invention.

FIG. 8 depicts a similar concept wherein a digital system 801 includes multiple digital function blocks (i.e., digital function block 1 805, digital function block 2 806 . . . digital function block k 807), which are separately powered by power supplies VDD 1 820, VDD 821 . . . VDD k 822. As shown, each associated ring oscillator sensor (i.e., ring oscillator sensor 1 810, ring oscillator sensor 2 811 . . . ring oscillator sensor k 812) is also powered by the same power supply as employed to power the associated digital function block being monitored. Thus, if one of the digital function blocks is, for example, repeatedly powered ON and OFF, the associated ring oscillator sensor for that digital function block is also repeatedly powered ON and OFF, which better correlates the aging of the sensor to aging of the digital function block. By way of example, a digital function block which comprises a floating point unit may be powered OFF when not in use in order to conserve power. Thus, the associated ring oscillator sensor is also powered OFF, in this embodiment, to better correlate aging of the ring oscillator sensor to the floating point unit.

Figure 9:
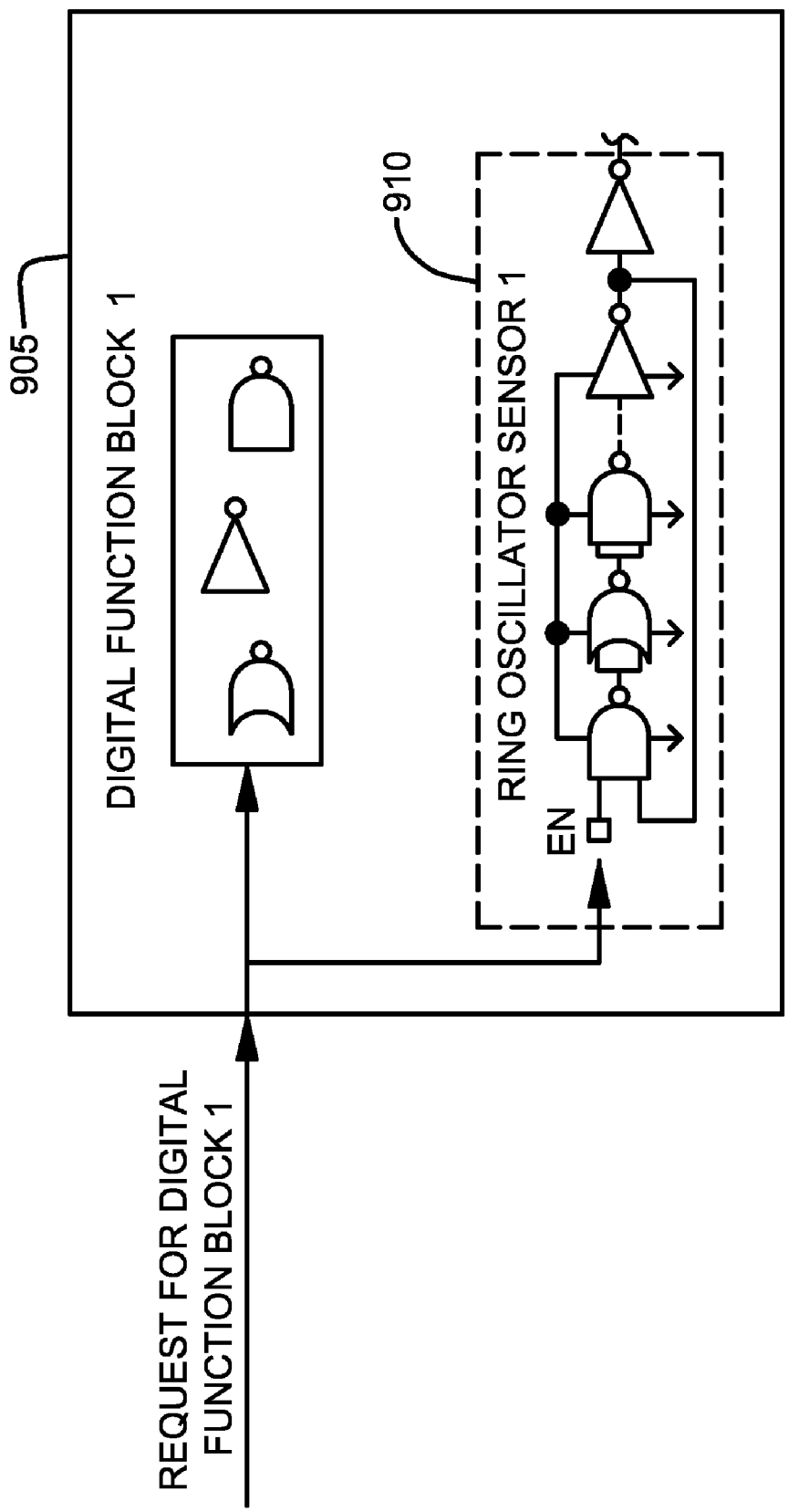
FIG. 9 depicts one embodiment of a digital function block and an associated ring oscillator sensor (of a monitoring system) which is enabled by a request received at the digital function block, in accordance with an aspect of the present invention.

FIG. 9 depicts one embodiment of a digital block 905 which is activated from a stand-by mode responsive to a request being received at the digital block. In this embodiment, the ring oscillator sensor 910 is similarly enabled only when the request is coming into the associated digital block. Thus, transitions are occurring within the ring oscillator sensor only when a request is received and being acted upon at the digital block.

Figure 10:
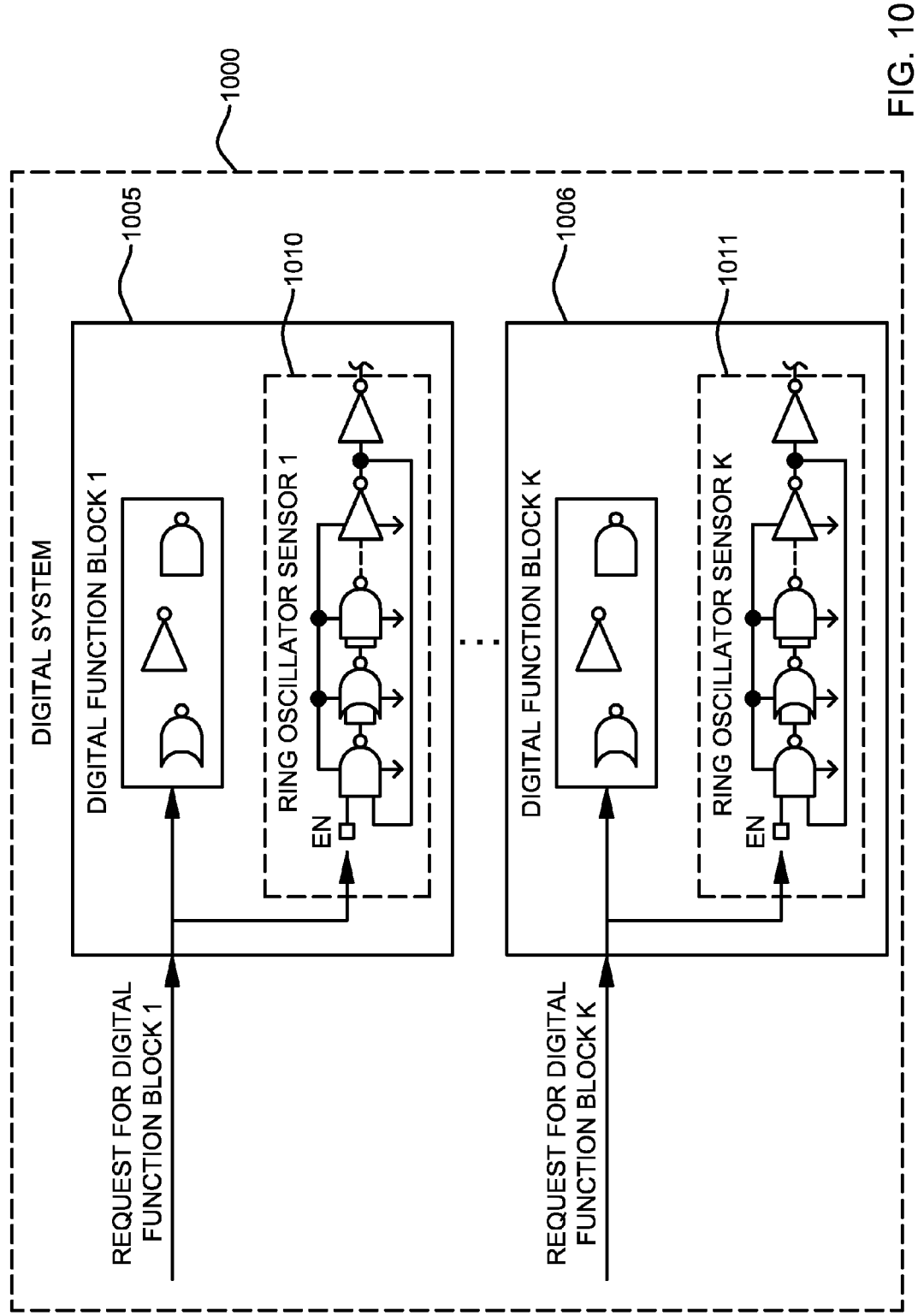
FIG. 10 depicts one embodiment of a digital system comprising multiple digital function blocks, each having an associated ring oscillator sensor (of a monitoring system) which is enabled by a respective request received at the digital function block being monitored, in accordance with an aspect of the present invention.

FIG. 10 illustrates a similar concept as shown in FIG. 9, only for a digital system 1000 comprising multiple digital function blocks (i.e., digital function block 1 1005 . . . digital function block k 1006), each of which receives its own computing request input. The associated ring oscillator sensors (ring oscillator sensor 1 1010 ... ring oscillator sensor k 1011) are electrically connected to also receive the respective request input as an enablement signal to enable the sensor when the associated digital function block is active.

Figure 11:
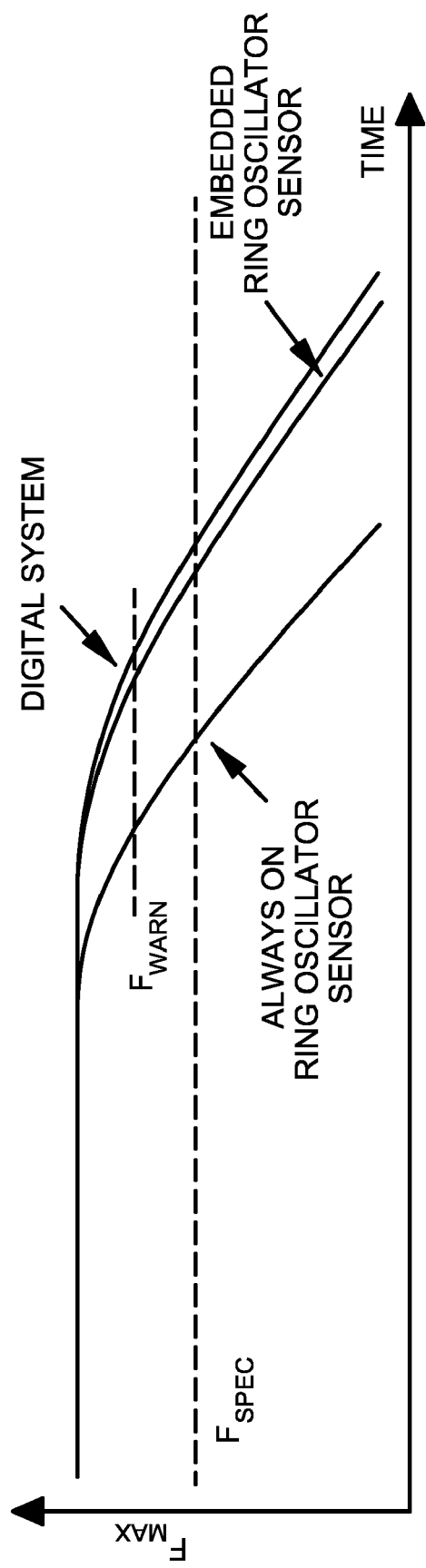
FIG. 11 graphically depicts digital system and correlated ring oscillator sensor lifecycles, illustrating oscillation frequency aging for two different ring oscillator sensors compared with aging of the maximum frequency of operation of the digital system, in accordance with an aspect of the present invention.

FIG. 11 graphically depicts digital system and ring oscillator sensor lifecycles, in accordance with aspects of the present invention. As illustrated, the lifecycle of the digital system begins with the digital system having a maximum frequency of operation ($F_{MAX}$) above a manufacturer specified minimum acceptable maximum frequency of operation ($F_{SPEC}$). As time passes, the digital system ages and gradually the maximum frequency of operation of the digital system ($F_{MAX}$) degrades to a level at or below the manufacturer specified required maximum frequency of operation ($F_{SPEC}$).

In accordance with an aspect of the present invention, a warning threshold frequency ($F_{WARN}$) is provided. This predefined warning threshold frequency ($F_{WARN}$) may be greater than or equal to the manufacturer specified required maximum frequency of operation of the digital system ($F_{SPEC}$). In the lifecycle illustration of FIG. 11, the warning threshold frequency of operation is above the manufacturer specified minimum frequency of operation, and when the maximum frequency of operation of the digital system ($F_{MAX}$) drops to or below the warning threshold frequency of operation ($F_{WARN}$), a warning signal is generated by the control logic and sent, for example, to an operating system of the digital system.

In this embodiment, the warning signal indicates that the maximum frequency of operation of the digital system ($F_{MAX}$) may be slower than the manufacturer specified maximum frequency of operation ($F_{SPEC}$) in the near future. At this point, the warning signal may also be provided to a user of the digital system so than an appropriate procedure, such as shutdown, can be taken. As explained further below, when the maximum frequency of operation of the digital system ($F_{MAX}$) is at or below the warning threshold frequency of operation of the digital system ($F_{WARN}$), the sampling rate for evaluating the frequency of operation may also be increased to more accurately monitor the digital system's status.

By correlating the composition and operation of the ring oscillator sensor to the digital system, the lifecycle of the embedded ring oscillator sensor can be tailored to closely match that of the digital system to be monitored. Thus, when the oscillation frequency of the embedded ring oscillator sensor described herein reaches the predefined warning threshold frequency ($F_{WARN}$), the warning signal can be generated, which is assumed to be indicative of a reliability degradation of the digital system itself. Also shown in this figure is a ring oscillator sensor which is not as closely correlated to the digital system aging. This alternate ring oscillator sensor may, for example, be powered and active continuously, in contrast to the digital system (which may alternatively be powered ON/OFF and/or selectively activated from a stand-by mode). In such a case, the alternative ring oscillator sensor could provide an earlier warning signal that digital system aging is beginning to occur. Also, as noted, when the oscillation frequency of the ring oscillator sensor is at or below the warning threshold frequency of operation of the digital system ($F_{WARN}$), the sampling rate for determining the oscillation frequency of the ring oscillator sensor may be increased to more accurately monitor the digital system's status as described further below.

FIGS. 12-15 depict various alternate embodiments for control logic of a monitoring system, in accordance with an aspect of the present invention.

Figure 12:
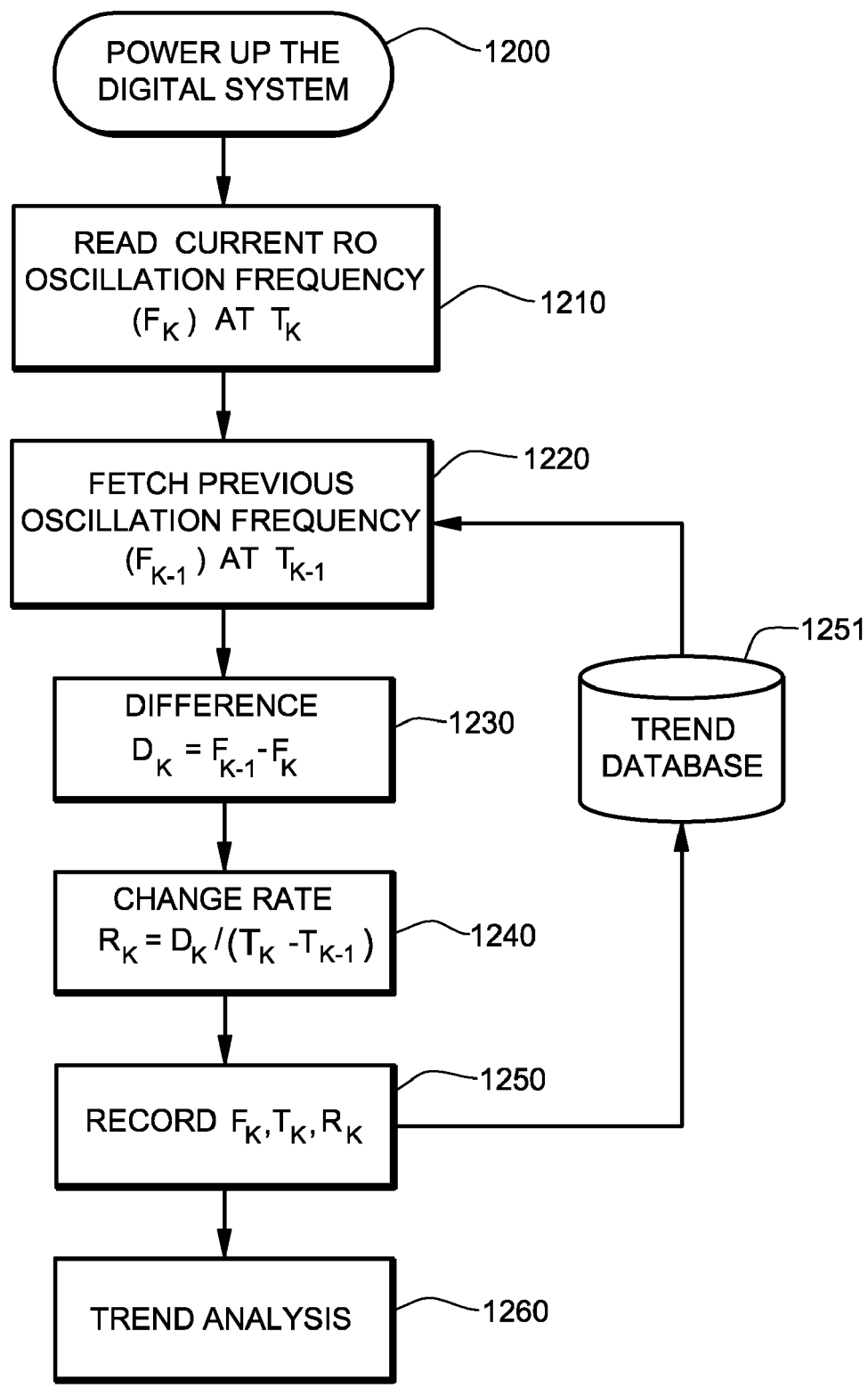
FIG. 12 is a flowchart of one embodiment of logic for tracking oscillation frequency of a ring oscillator sensor, in accordance with an aspect of the present invention.

FIG. 12 depicts one embodiment for tracing oscillation frequency of a ring oscillator sensor, in accordance with an aspect of the present invention. Upon power-up of the digital system 1200, the current oscillation frequency of the ring oscillator sensor ($F_K$) is read at a time ($T_K$) 1210. In one embodiment, reading of the current oscillation frequency of the ring oscillator sensor is synonymous with determining the current oscillation frequency of the ring oscillator sensor. The logic also fetches the previous oscillation frequency ($F_{K-1}$) of the ring oscillator sensor at time $T_{K-1}$ 1220. This previous oscillation frequency can be retrieved from a trend database 1251, which is accessible by the control logic. The difference ($D_K$) between the previous oscillation frequency of the ring oscillator sensor and the current ring oscillation frequency of the ring oscillator sensor is determined 1230, and the rate of change ($R_K$) in the difference is calculated 1240. The measured oscillation frequency of the ring oscillator sensor ($F_K$), at time $T_K$ is then recorded in the trend database, along with the rate of change ($R_K$) in the difference ($D_K$) between oscillation frequencies of the ring oscillator sensor 1250. After this, trend analysis 1260 may be performed, either commensurate with each periodic determination of the oscillation frequency of the ring oscillator sensor, or at some other specified interval.

Figure 13:
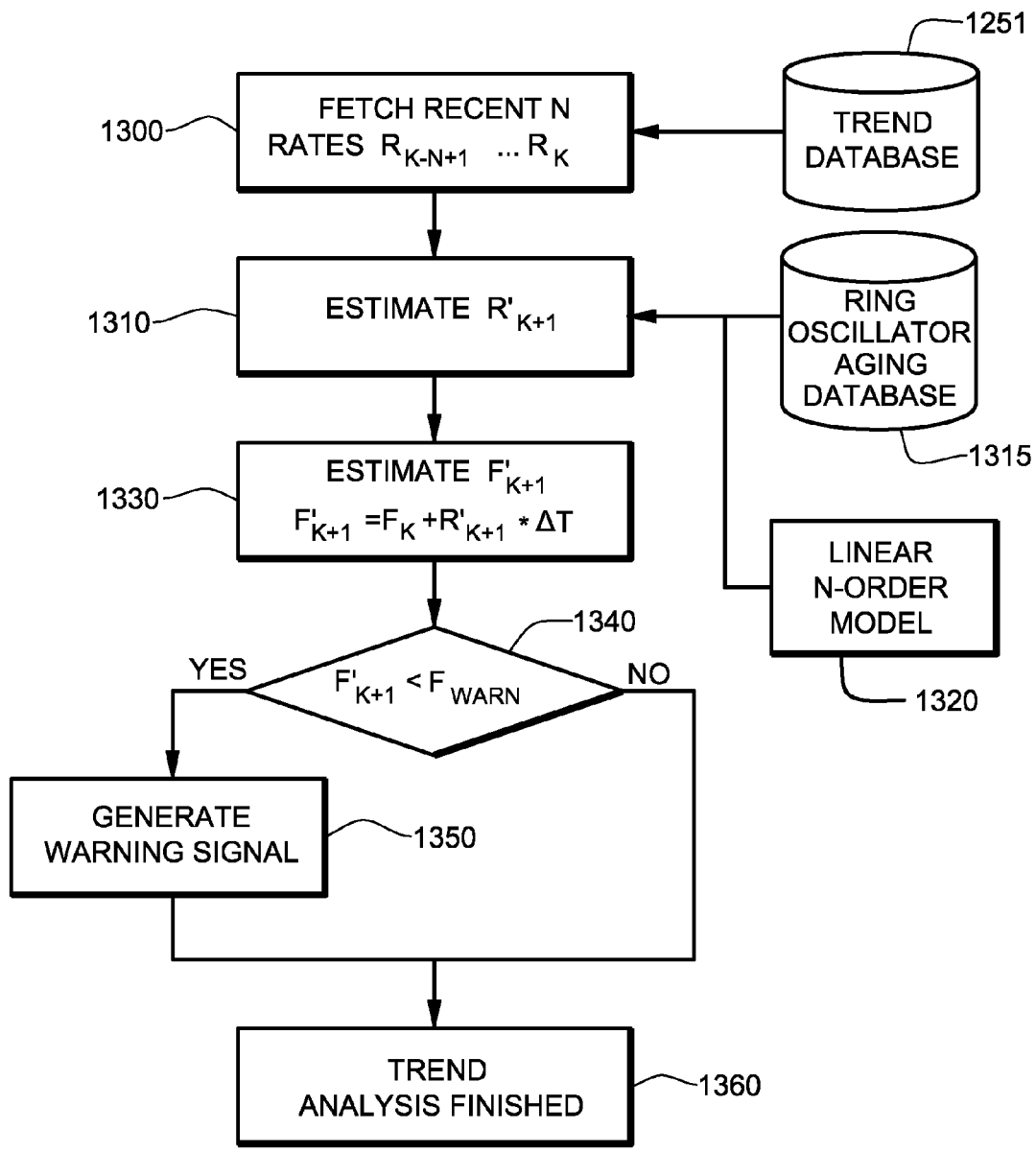
FIG. 13 is a flowchart of one embodiment of logic for performing oscillation frequency trend analysis, and for generating a warning signal based thereon, in accordance with an aspect of the present invention.

FIG. 13 depicts one embodiment of a trend analysis approach wherein N most recent rates of change in the difference between measured oscillation frequencies of the ring oscillator sensor are fetched 1300 from the trend database 1251. From these values, a next rate of change ($R'_{K+1}$) in the difference between measured oscillation frequencies of the ring oscillator sensor is estimated 1310. This estimated next rate of change ($R'_{K+1}$) in the difference between measured oscillation frequencies of the ring oscillator sensor can be determined employing conventional linear model estimation, such as a linear order model 1320, wherein a linear prediction is made from the previous N rate of change determinations. Alternatively, historical aging information obtained from a ring oscillator aging database 1315 can be employed. By way of example, the historical aging information may contain information gathered through conventional burn-in testing of the ring oscillator sensor. Alternatively, historical aging information could be derived from measuring aging of other ring oscillator sensors of the particular type as the current ring oscillator sensor being evaluated. Depending upon the ring oscillator sensor, this historical aging information may provide a more accurate estimate of the next rate of change in the difference between oscillation frequencies of the ring oscillator sensor than a linear progression model.

In the protocol of FIG. 13, the next oscillation frequency of the ring oscillator sensor ($F'_{K+1}$) is estimated 1330, after which the logic determines whether the estimated oscillation frequency ($F'_{K+1}$) is less than the predefined warning threshold frequency ($F_{WARN}$) 1340. If so, then a warning signal is generated 1350, which completes trend analysis 1360. Assuming that the estimated next oscillation frequency of the ring oscillator sensor ($F'_{K+1}$) is greater than the predefined warning threshold frequency ($F_{WARN}$), then no warning signal is generated, and trend analysis is finished 1360.

Figure 14:
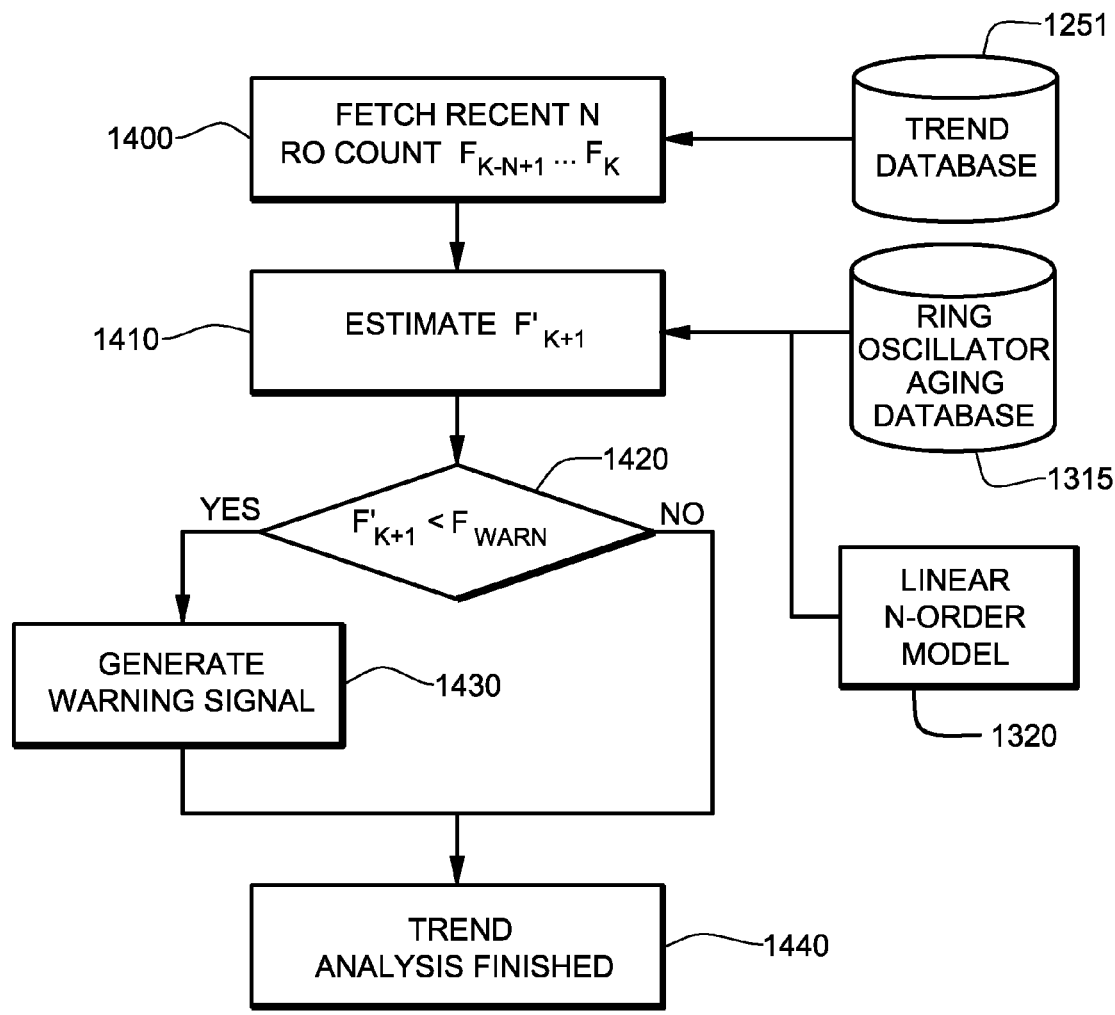
FIG. 14 is a flowchart of an alternate embodiment of logic for performing oscillation frequency trend analysis, and for generating a warning signal based thereon, in accordance with an aspect of the present invention.

The logic of FIG. 14 is similar to the logic of FIG. 13, with the exception that the next oscillation frequency of the ring oscillator sensor ($F'_{K+1}$) is estimated directly from N prior saved measured oscillation frequencies of the ring oscillator sensor. Specifically, the most recent N prior saved measured oscillation frequencies of the ring oscillator sensor are fetched 1400 from the trend database 1251, and from these values, the next oscillation frequency of the ring oscillator sensor ($F'_{K+1}$) is estimated 1410 using, for example, linear N-order model analysis 1320 or historical aging information obtained from a ring oscillator aging database 1315. If the estimated next oscillation frequency of the ring oscillator sensor ($F'_{K+1}$) is less than the predefined warning threshold frequency ($F_{WARN}$) 1420, then a warning signal is generated 1430, thereby completing trend analysis 1440. No warning signal is generated if the estimated next oscillation frequency of the ring oscillator sensor is above the warning threshold frequency.

Figure 15:
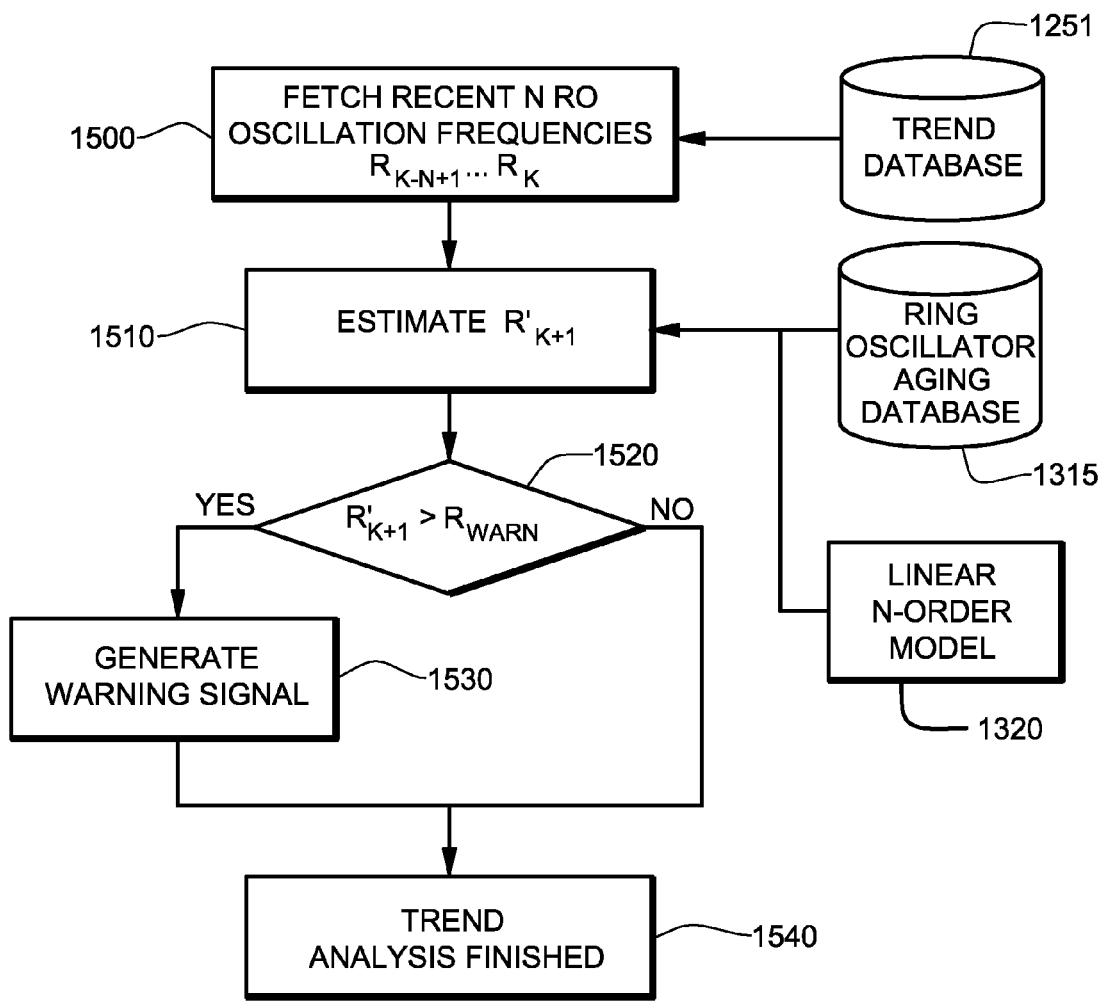
FIG. 15 is a flowchart of another embodiment of logic for performing oscillation frequency trend analysis, and for generating a warning signal based thereon, in accordance with an aspect of the present invention.

FIG. 15 depicts a further embodiment of a trend analysis approach wherein N most recent rates of change in the difference between measured oscillation frequencies of the ring oscillator sensor are fetched 1500 from the trend database 1251. From these values, a next rate of change ($R'_{K+1}$) in the difference between measured oscillation frequencies of the ring oscillator sensor is estimated 1510. This estimated next rate of change ($R'_{K+1}$) in the difference between measured oscillation frequencies of the ring oscillator sensor can be determined employing conventional linear model estimation, such as a linear N-order model 1320, or alternatively, historical aging information obtained from a ring oscillator aging database 1315. The estimated next rate of change ($R'_{K+1}$) is then compared against an acceptable rate of change threshold ($R_{WARN}$) for the digital system 1520. If the estimated next rate of change is greater than the acceptable rate of change threshold, then a warning signal is generated 1530, which completes trend analysis 1540. Assuming that the estimated next rate of change in the difference between measured oscillation frequencies of the ring oscillator sensor is below the acceptable rate of change threshold for the digital system, trend analysis is finished 1540.

Figure 16:
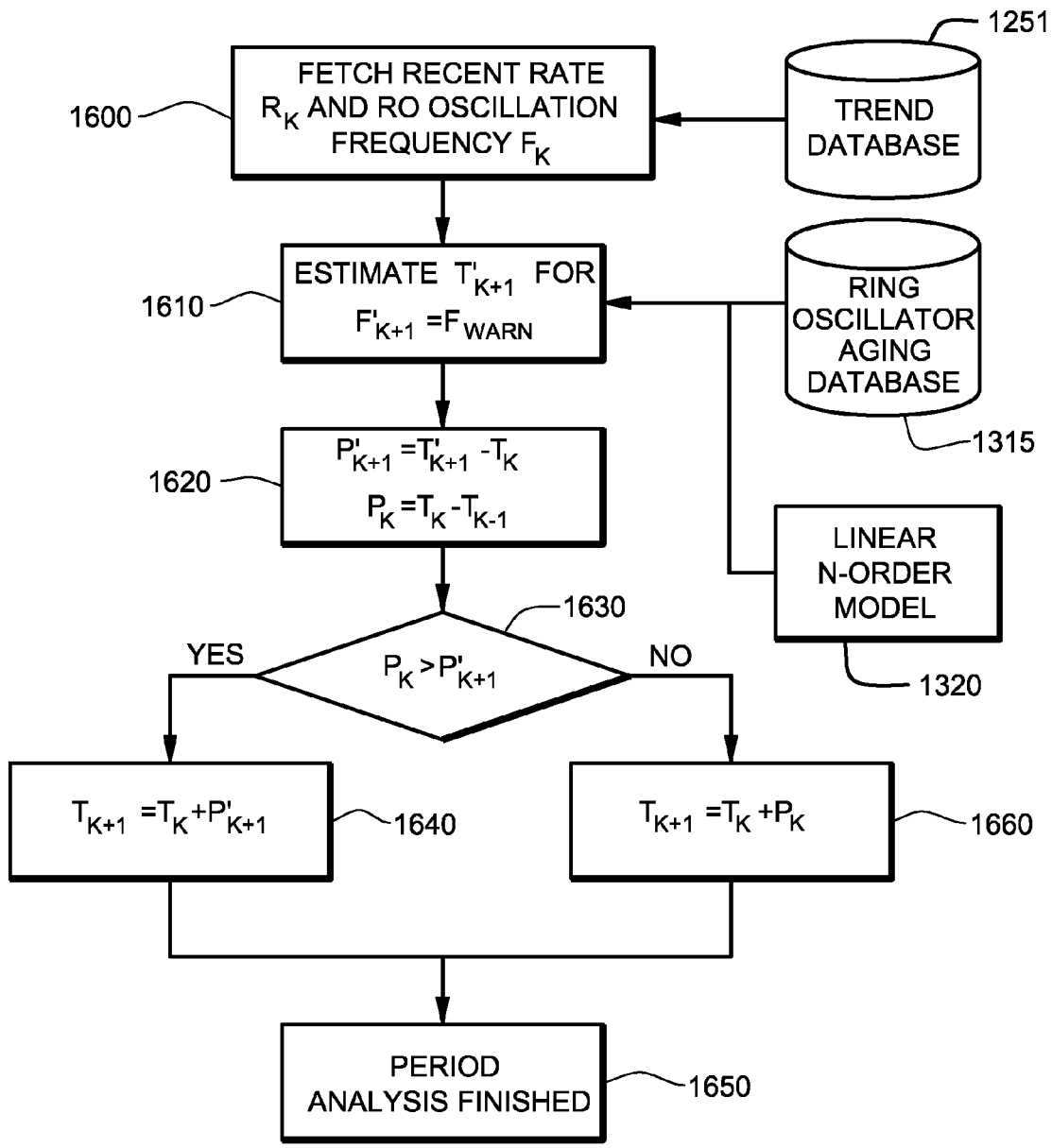
FIG. 16 is a flowchart of one embodiment of logic for implementing a variable sampling period for evaluating oscillation frequency of a ring oscillator sensor, in accordance with an aspect of the present invention.

FIG. 16 depicts one embodiment for analyzing and dynamically adjusting the sampling period employed by the control logic in periodically evaluating the oscillation frequency of the ring oscillator sensor.

In FIG. 16, an approach is presented for determining a next time in which to sample the oscillation frequency of the ring oscillator sensor. In this approach, the most recently determined rate of change in the difference between oscillation frequencies, as well as the most recently measured oscillation frequency of the ring oscillator sensor, are retrieved 1600 from the trend database 1251 and used to estimate a time interval ($T'_{K+1}$) for when an estimated oscillation frequency of the ring oscillator sensor ($F'_{K+1}$) will be equal to the warning threshold frequency of operation ($F_{WARN}$) 1610. This estimate can again be obtained either using historical aging information on the ring oscillator sensor (or alternatively, on the digital system type to which the ring oscillator sensor is correlated) which is retrieved, for example, from historical aging database 1315, or by linear progression analysis using a linear N-order model 1320. The estimated sampling time at which the estimated oscillation frequency of the ring oscillator sensor will be at the predefined warning threshold frequency is then used to determine an estimated sampling period to arrive at that predefined warning threshold frequency 1620. This estimated sampling period ($P'_{K+1}$) is then compared against the previously employed sampling period ($P_K$) used in measuring the most recently obtained oscillation frequency of the ring oscillator sensor 1630. If the previously employed sampling period is greater than the estimated sampling period to arrive at the predefined warning threshold frequency ($F_{WARN}$), then the sampling time employed for the next measurement of the oscillation frequency of the ring oscillator sensor is the prior sampling time plus the estimated sampling period until the oscillation frequency reaches the predefined warning threshold frequency 1640. Alternatively, if the previously employed sampling period is less than the estimated sampling period until the oscillation frequency reaches the predefined warning threshold frequency ($P'_{K+1}$), then the next sampling time is the prior sampling time plus the previously employed sampling period ($P_K$) 1660. Once the sampling time for the next determination of the oscillation frequency of the ring oscillator sensor is determined, sampling period analysis is complete 1650.

As a further variation, the above-described control protocol may be integrated with a control protocol such as described in commonly assigned, co-pending U.S. patent application Ser. No. 11/733,318, filed Apr. 10, 2007, and entitled "Monitoring Reliability of a Digital System", the entirety of which is hereby incorporated herein by reference. Briefly summarized, this co-pending application describes a further technique for continually monitoring reliability, or aging, of a digital system and for issuing a warning signal if digital system operation degrades to or past a specified threshold. The technique includes periodically determining a maximum frequency of operation of the digital system, and generating a warning signal indicative of a reliability degradation of the digital system if at least one of: (i) a measured or estimated maximum frequency of operation of the digital system is below a warning threshold frequency of operation of the digital system, wherein the warning threshold frequency is greater than or equal to a manufacturer specified minimum required maximum frequency of operation for the digital system; or (ii) a rate of change in the difference between measured maximum frequencies of operation of the digital system exceeds an acceptable rate of change threshold for the digital system. By way of example, the warning signal may be generated only if both control protocols agree, that is, evaluation of oscillation frequencies of the at least one ring oscillator sensor indicates reliability degradation thereof, and evaluation of the maximum frequency of operation of the digital system indicates reliability degradation thereof.

One or more aspects of the present invention can be included in an article of manufacture (e.g., one or more computer program products) having, for instance, computer usable media. The media has therein, for instance, computer readable program code means or logic (e.g., instructions, code, commands, etc.) to provide and facilitate the capabilities of the present invention. The article of manufacture can be included as a part of a computer system or sold separately.

Figure 17:
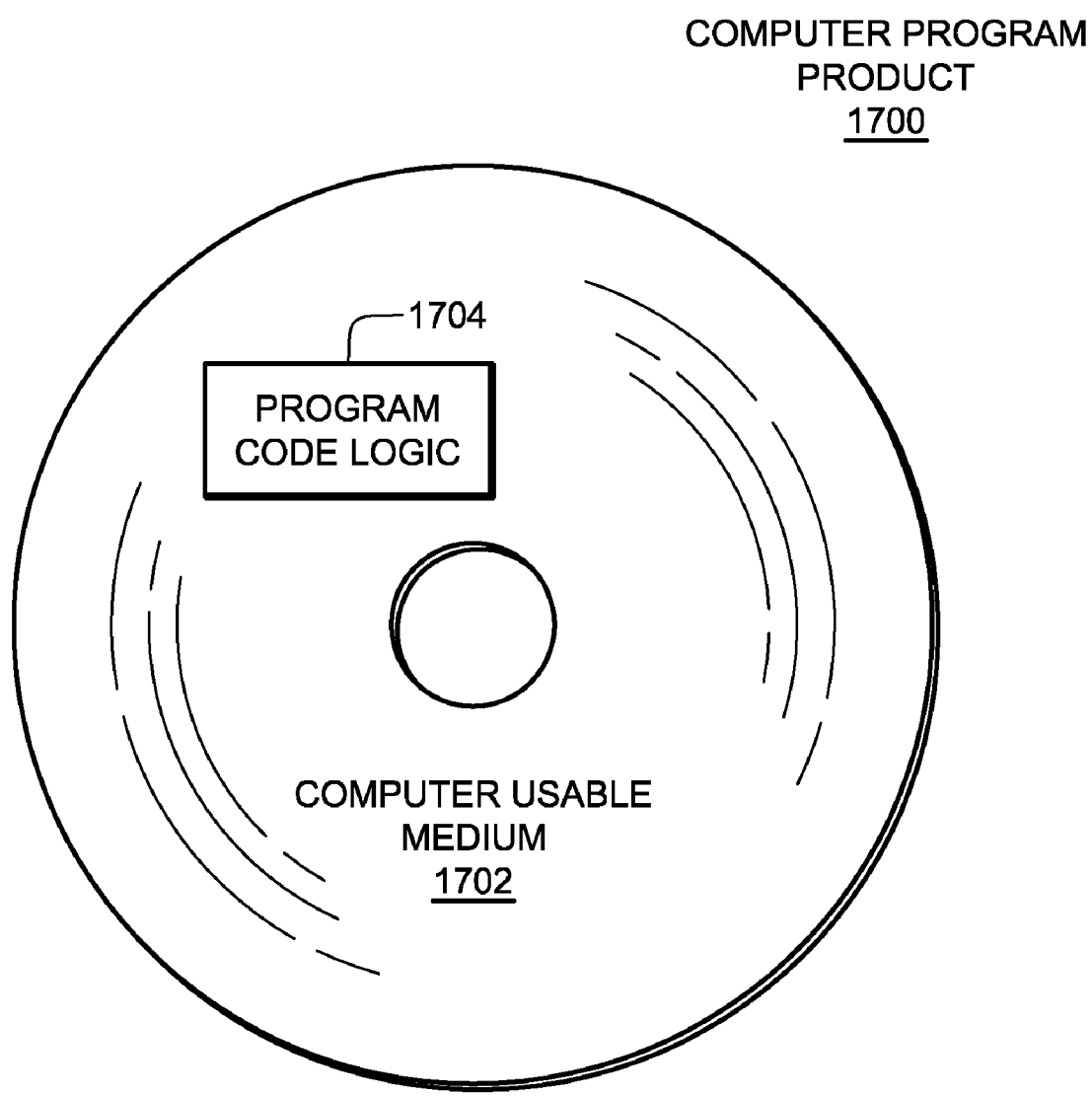
FIG. 17 depicts one embodiment of a computer program product to incorporate one or more aspects of the present invention.

One example of an article of manufacture or a computer program product incorporating one or more aspects of the present invention is described with reference to FIG. 17. A computer program product 1700 includes, for instance, one or more computer usable media 1702 to store computer readable program code means or logic 1704 thereon to provide and facilitate one or more aspects of the present invention. The medium can be an electronic, magnetic, optical, electromagnetic, infrared, or semiconductor system (or apparatus or device) or a propagation medium. Examples of a computer readable medium include a semiconductor or solid state memory, magnetic tape, a removable computer diskette, a random access memory (RAM), a read-only memory (ROM), a rigid magnetic disk and an optical disk. Examples of optical disks include compact disk-read only memory (CD-ROM), compact disk-read/write (CD-R/W) and DVD.

A sequence of program instructions or a logical assembly of one or more interrelated modules defined by one or more computer readable program code means or logic direct the performance of one or more aspects of the present invention.

Advantageously, a data structure of readily accessible units of memory is provided. By employing this data structure, memory access and system performance are enhanced (e.g., faster). The data structure includes designations (e.g., addresses) of one or more units of memory (e.g., pages) that while in the data structure do not need address translation or any other test to be performed in order to access the unit of memory. This data structure can be used in any type of processing environment including emulated environments.

Although various embodiments are described above, these are only examples. For instance, one or more aspects of the present invention can be included in environments that are not emulated environments. Further, one or more aspects of the present invention can be used in emulated environments that have a native architecture that is different than the one described above and/or emulates an architecture other than the z/Architecture®. Various emulators can be used. Emulators are commercially available and offered by various companies. Additional details relating to emulation are described in *Virtual Machines: Versatile Platforms For Systems and Processes* (*The Morgan Kaufmann Series in Computer Architecture and Design*), Jim Smith and Ravi Nair, Jun. 3, 2005, which is hereby incorporated herein by reference in its entirety.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The capabilities of one or more aspects of the present invention can be implemented in software, firmware, hardware, or some combination thereof. At least one program storage device readable by a machine embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted, or modified. All of these variations are considered a part of the claimed invention.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A system for monitoring reliability of a digital system, the system comprising:
   at least one ring oscillator sensor implemented in association with the digital system for facilitating monitoring reliability thereof, the digital system including a circuit composition comprising at least one logic type, the at least one logic type comprising at least one device type, and wherein the at least one ring oscillator sensor includes a circuit composition comprising one or more of the at least one logic type or the at least one device type of the digital system selected based on the circuit composition of the digital system to correlate aging of the at least one ring oscillator sensor to aging of the digital system, the at least one ring oscillator sensor outputting count signals;
   counter logic coupled to the at least one ring oscillator sensor for converting the count signals to an oscillation frequency of the at least one ring oscillator sensor; and
   control logic coupled to the counter logic for periodically evaluating oscillation frequency of the at least one ring oscillator sensor and generating a warning signal indicative of reliability degradation thereof, and hence of the digital system, if at least one of:
   (i) a measured or estimated oscillation frequency of the at least one ring oscillator sensor is below a warning threshold frequency for the digital system; or
   (ii) a measured or estimated rate of change in a difference between measured oscillation frequencies of the at least one ring oscillator sensor exceeds an acceptable rate of change threshold for the digital system.

2. The system of claim 1, wherein the circuit composition of the digital system comprises multiple logic types, and the circuit composition of the at least one ring oscillator sensor also comprises the multiple logic types, wherein percentages of specific logic types of the multiple logic types within the at least one ring oscillator sensor mirror percentages of specific logic types of the multiple logic types within the digital system.

3. The system of claim 1, wherein the circuit composition of the digital system comprises multiple device types, and the circuit composition of the at least one ring oscillator sensor also comprises the multiple device types, wherein percentages of specific device types of the multiple device types within the at least one ring oscillator sensor mirror percentages of specific device types of the multiple device types within the digital system.

4. The system of claim 1, wherein the circuit composition of the digital system comprises multiple logic types and multiple device types, and wherein the circuit composition of the at least one ring oscillator sensor also comprises the multiple logic types and the multiple device types of the digital system, wherein percentages of specific logic types of the multiple logic types and specific device types of the multiple device types within the at least one ring oscillator sensor mirror percentages of specific logic types of the multiple logic types and specific device types of the multiple device types within the digital system.

5. The system of claim 1, wherein the digital system comprises multiple digital function blocks and multiple circuit areas, and wherein the system further comprises multiple ring oscillator sensors, each ring oscillator sensor being associated with at least one of the multiple digital function blocks or multiple circuit areas of the digital system to mirror at least one of a logic type or a device type composition thereof and provide count signals useful in monitoring aging of the associated at least one digital function block or circuit area of the digital system.

6. The system of claim 1, wherein the circuit composition of the digital system comprises multiple logic types, the multiple logic types comprising at least two of AND logic, NAND logic, OR logic, NOR logic, and INVERTER logic, and wherein the multiple logic types of the digital system further comprise at least one device type, the at least one device type comprising one or more of a thin oxide device, a thick oxide device, a low VT-doped device or a high VT-doped device.

7. The system of claim 1, wherein the digital system and the at least one ring oscillator sensor are powered by a common power supply.

8. The system of claim 1, wherein the digital system comprises multiple digital function blocks, and wherein the system further comprises multiple ring oscillator sensors, each ring oscillator sensor being embedded within a respective digital function block of the multiple digital function blocks, and wherein each digital function block and associated ring oscillator sensor are powered by a common power supply.

9. The system of claim 1, wherein the digital system further comprises at least one digital function block, and the at least one ring oscillator sensor is associated with the at least one digital function block, and wherein the at least one ring oscillator sensor further comprises an enable input electrically coupled to an input of the associated at least one digital function block, the at least one ring oscillator sensor being enabled with receipt of a request at the associated at least one digital function block.

10. The system of claim 1, wherein the control logic employs multiple determined oscillation frequencies of the at least one ring oscillator sensor in estimating a next oscillation frequency of the at least one ring oscillator sensor, and wherein the generating of the warning signal comprises generating the warning signal if the estimated next oscillation frequency of the at least one ring oscillator sensor is below the warning threshold frequency.

11. The system of claim 1, wherein the control logic periodically determines a rate of change in a difference between measured oscillation frequencies of the at least one ring oscillator sensor, and employs multiple determined rates of change between measured oscillation frequencies of the at least one ring oscillator sensor in estimating a next rate of change employing one of a linear model estimation or a historical aging data for the at least one ring oscillator sensor, and wherein the control logic estimates a next oscillation frequency of the at least one ring oscillator sensor employing the estimated next rate of change in the difference between measured oscillation frequencies of the at least one ring oscillator sensor, and wherein generating the warning signal comprises generating the warning signal if the estimated next oscillation frequency of the at least one ring oscillator sensor is below a warning threshold frequency for the digital system.

12. The system of claim 1, wherein the control logic further dynamically adjusts a sampling period employed in the periodically evaluating oscillation frequency of the at least one ring oscillator sensor, the dynamically adjusting comprising:
  estimating a time interval from a most recent determination of oscillation frequency of the at least one ring oscillator sensor to the at least one ring oscillator sensor reaching the warning threshold frequency;
  employing the estimated time interval in setting a next sampling period for determining the oscillation frequency of the at least one ring oscillator sensor;
  determining whether the next sampling period is less than a previous sampling period employed in the periodically evaluating oscillation frequency of the at least one ring oscillator sensor; and
  if so, increasing the sampling period to increase the sampling rate of the periodically evaluating oscillation frequency of the at least one ring oscillator sensor.

13. A system for monitoring reliability of a digital system, the system comprising:
  at least one ring oscillator sensor embedded within a digital system for facilitating monitoring reliability thereof, the digital system including a circuit composition comprising at least one logic type, and at least one device type employed in the at least one logic type, and wherein the at least one ring oscillator sensor includes a circuit composition at least partially mirroring percentages of the at least one logic type and the at least one device type employed in the circuit composition of the digital system, wherein aging of the at least one ring oscillator sensor is correlated to aging of the digital system, the at least one ring oscillator sensor outputting count signals;
  counter logic coupled to the at least one ring oscillator sensor for converting the count signals to an oscillation frequency of the at least one ring oscillator sensor; and
  control logic coupled to the counter logic for periodically evaluating oscillation frequency of the at least one ring oscillator sensor and generating a warning signal indicative of reliability degradation thereof, and hence of the digital system, if at least one of:
    (i) a measured or estimated oscillation frequency of the at least one ring oscillator sensor is below a warning threshold frequency for the digital system; or
    (ii) a measured or estimated rate of change in a difference between measured oscillation frequencies of the at least one ring oscillator sensor exceeds an acceptable rate of change threshold for the digital system.

14. The system of claim 13, wherein the digital system and the at least one ring oscillator sensor are powered by a common power supply, logic and device type circuit composition of the at least one ring oscillator sensor mirrors percentages of logic and device types employed in the digital system, and the at least one ring oscillator sensor is enabled only when the digital system is active, thereby facilitating correlating aging of the at least one ring oscillator sensor to aging of the digital system.

15. A method of monitoring reliability of a digital system, the method comprising:
  obtaining at least one ring oscillator sensor embedded within a digital system for facilitating monitoring reliability thereof, the digital system including a circuit composition comprising at least one logic type, the at least one logic type comprising at least one device type, and wherein logic and device type composition percentages for the at least one ring oscillator sensor mirror circuit composition percentages of one or more of the at least one logic type or the at least one device type within the digital system to correlate aging of the at least one ring oscillator sensor to aging of the digital system, the at least one ring oscillator sensor outputting count signals;
  converting the count signals of the at least one ring oscillator sensor to an oscillation frequency of the at least one ring oscillator sensor; and
  periodically evaluating oscillation frequency of the at least one ring oscillator sensor, and generating a warning signal indicative of a reliability degradation thereof, and hence of the digital system, if at least one of:
    (i) a measured or estimated oscillation frequency of the at least one ring oscillator sensor is below a warning threshold frequency for the digital system; or
    (ii) a measured or estimated rate of change in a difference between measured oscillation frequencies of the at least one ring oscillator sensor exceeds an acceptable rate of change threshold for the digital system.

16. The method of claim 15, wherein the circuit composition of the digital system comprises multiple logic types and multiple device types, and wherein the circuit composition of the at least one ring oscillator sensor also comprises the multiple logic types and the multiple device types of the digital system, wherein percentages of specific logic types of the multiple logic types and specific device types of the multiple device types within the at least one ring oscillator sensor mirror percentages of specific logic types of the multiple logic types and specific device types of the multiple device types within the digital system.

17. The method of claim 15, wherein the digital system comprises multiple digital function blocks and multiple circuit areas, and wherein the obtaining further comprises obtaining multiple ring oscillator sensors, each ring oscillator sensor being associated with at least one of the multiple digital function blocks or multiple circuit areas of the digital system to mirror at least one of a logic type or a device type composition thereof and provide count signals useful in monitoring aging of the associated at least one digital function block or circuit area of the digital system.

18. The method of claim 15, wherein the digital system and the at least one ring oscillator sensor are powered by a common power supply, and wherein the method further comprises enabling the at least one ring oscillator sensor only when the digital system is active, thereby facilitating correlating aging of the at least one ring oscillator sensor with aging of the digital system.

19. The method of claim 15, wherein the digital system further comprises multiple digital function blocks, and the obtaining comprises obtaining multiple ring oscillator sensors, each ring oscillator sensor being embedded within a respective digital function block of the multiple digital function blocks, and wherein each digital function block and associated ring oscillator sensor share a power supply and the associated ring oscillator sensor is only enabled when the digital function block is active.

20. The method of claim 15, wherein the circuit composition of the digital system comprises multiple logic types, the multiple logic types comprising at least two of AND logic, NAND logic, OR logic, NOR logic, and INVERTER logic, and wherein the multiple logic types of the digital system further comprise at least one device type, the at least one device type comprising one or more of a thin oxide device, a thick oxide device, a low VT-doped device, or a high VT-doped device.

* * * * *